(12) United States Patent
Nakanishi et al.

(10) Patent No.: US 7,930,822 B2
(45) Date of Patent: Apr. 26, 2011

(54) METHOD AND DEVICE FOR MANUFACTURING A CONDUCTIVE MEMBER FOR NON-CONTACT TYPE DATA CARRIER

(75) Inventors: Yuki Nakanishi, Tokyo (JP); Hideto Sakata, Tokyo (JP); Akihiko Igarashi, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 853 days.

(21) Appl. No.: 11/578,311

(22) PCT Filed: Apr. 20, 2005

(86) PCT No.: PCT/JP2005/007527
§ 371 (c)(1),
(2), (4) Date: Jan. 25, 2007

(87) PCT Pub. No.: WO2005/107347
PCT Pub. Date: Nov. 10, 2005

(65) Prior Publication Data
US 2007/0214637 A1    Sep. 20, 2007

(30) Foreign Application Priority Data

Apr. 28, 2004 (JP) ............... P2004-134659
Mar. 2, 2005 (JP) ............... P2005-058239
Apr. 1, 2005 (JP) ............... P2005-106822

(51) Int. Cl.
*H05K 3/02* (2006.01)
(52) U.S. Cl. ............ 29/847; 29/830; 29/851; 156/233; 156/248; 156/251

(58) Field of Classification Search .......... 156/233, 156/248, 251, 261, 288, 324, 516; 174/259; 29/829, 830, 846–849, 851
See application file for complete search history.

(56) References Cited

U.S. PATENT DOCUMENTS
3,573,126 A * 3/1971 Kougel ............ 156/251
(Continued)

FOREIGN PATENT DOCUMENTS

| DE | 101 45 749 A1 | 4/2003 |
| JP | 9044762 | 2/1997 |
| JP | 10-187922 A | 7/1998 |
| JP | 2001-184476 | 7/2001 |
| JP | 2002-298109 | 10/2002 |

(Continued)

OTHER PUBLICATIONS

European Search Report: EP 05 73 4388.

*Primary Examiner* — Donghai D. Nguyen
(74) *Attorney, Agent, or Firm* — Ladas & Parry LLP

(57) ABSTRACT

A conductive member for a non-contact type data carrier such as a wireless tag is simply and cheaply manufactured. A method for manufacturing a conductive member for a non-contact type data carrier comprises: a printing process during which, while a base material (4) is run, a bonding agent layer (5) is printed in a predetermined pattern on the surface thereof, and is dried; a bonding process during which a conductive layer (6) is laminated on the surface of the bonding agent layer (5) for heating and bonding; a punching process during which the conductive layer (6) is punched in the above-described pattern on the base material (4); and a separating process during which an unnecessary portion (6b) of the conductive layer (6) is separated from the base material (4). Accordingly, a conventional multilayered laminated sheet is not required to realize reduction in the material.

2 Claims, 32 Drawing Sheets

U.S. PATENT DOCUMENTS

| | | | | |
|---|---|---|---|---|
| 3,713,944 A | * | 1/1973 | Dennis et al. | 29/829 |
| 4,091,125 A | | 5/1978 | Delgadillo | |
| 4,682,415 A | * | 7/1987 | Adell | 29/846 |
| 5,645,932 A | * | 7/1997 | Uchibori | 156/248 |
| 5,759,422 A | | 6/1998 | Schmelzer et al. | |
| 6,320,556 B1 | | 11/2001 | Cyman et al. | |

FOREIGN PATENT DOCUMENTS

| | | |
|---|---|---|
| JP | 2002-366915 | 12/2002 |
| JP | 2004-094590 | 3/2004 |
| WO | 03/107266 A1 | 12/2003 |

* cited by examiner

METHOD AND DEVICE FOR MANUFACTURING A CONDUCTIVE MEMBER FOR NON-CONTACT TYPE DATA CARRIER

TECHNOLOGICAL FIELD

The present invention relates to a conductive member for a non-contact type data carrier such as an antenna, an interposer, and a bridge, and a method and a device for manufacturing the same.

BACKGROUND ART

A conductive member for a non-contact type data carrier such as an antenna is used to make, for example, a wireless tag used for a commodity.

When an antenna as a conductive member for a non-contact type data carrier is formed in a predetermined pattern, the antenna has been manufactured by etching after forming a resist pattern on a metal layer such as an aluminum layer and a copper one laminated on a base material.

Moreover, there has been another method by which the antenna is directly formed, using a punching blade. According to the method, there is prepared a layered body obtained by applying a thermoplastic bonding agent on metal foil after the metal foil is bonded to a carrier such as a plastic film through a peeling layer and an adhesive agent. Then, a slit is made on the metal foil as this layered body according the above-described pattern. The layered body is superposed on a base material, and is pressed and heated with a mold having a convex portion which corresponding to the above-described pattern. Thereby, the bonding property of the adhesive agent is reduced, and that of thermoplastic bonding agent is increased. The metal foil patterned by the slit is adhered to the base material, and excess metal foil is separated together with the adhesive agent to form an antenna and the like (for example, refer to Patent Document 1).

Patent Document 1: Japanese Patent Application Laid-Open No. 09-044762

According to the conventional manufacturing methods, there is a problem that the punching blade of the metal foil and the metal mold are required to be made so that the patterns are in accurate accordance with each other and operations are in exact synchronization to obtain an accurate pattern of an antenna and the like. There is another problem that, as a layered body is required to be used as a material, a material used for the layered body is increased.

Moreover, a second problem is that there is a possibility that air bubbles and the like exist between the metal foil and the base material, the edge of the pattern is curled from the base material after pattern punching for the antenna and the like, and the metal foil has a wavy surface. The second problem causes reduction in the performance of the antenna and the like.

A third problem is a possibility that, when the metal foil is punched with the punching blade, there is caused defective punching, insufficient melting of the bonding agent, or inconsistencies in pressing. The third problem causes unreliable forming of the pattern of the antenna and the like.

A fourth problem is that, when the metal foil is bonded to the base material, a bonding agent, which should not be heated is required to be used in some cases.

Accordingly, the present invention has an object to provide means to solve the above-described problems.

DISCLOSURE OF INVENTION

In order to solve the above-described problems, the invention recited in claim 1 adopts a conductive member for a non-contact type data carrier, wherein a bonding agent layer (5, 32) is formed on a base material (4) in a predetermined pattern, and a conductive layer (6) comprising metal foil or alloy foil with an approximately similar pattern to said pattern is bonded to the surface of the bonding agent layer (5, 32).

Moreover, the invention recited in claim 2 adopts the conductive member for a non-contact type data carrier according to claim 1 of the invention, wherein a slit (7) cutting the conductive layer (6) is formed on the base material (4) along the outline of the conductive layer (6).

Moreover, the invention recited in claim 3 adopts the conductive member for a non-contact type data carrier according to claim 1 or 2 of the invention, wherein the surface of the conductive layer (6) is covered with a protective layer (28).

Moreover, the invention recited in claim 4 adopts a method for manufacturing a conductive member for a non-contact type data carrier, comprising: a bonding step of laminating a conductive layer (6) on which a thermoplastic bonding agent layer (5) is formed from the thermoplastic boding agent side, while traveling the base material (4), and heating and bonding the conductive layer (6) in a predetermined pattern; and step of punching out the conductive layer (6) on the base material (4) in the predetermined pattern.

Moreover, the invention recited in claim 5 adopts the method for manufacturing a conductive member for a non-contact type data carrier according to claim 4 of the invention, wherein the punching process is performed after the bonding step is completed.

Moreover, the invention recited in claim 6 adopts the method for manufacturing a conductive member for a non-contact type data carrier according to claim 4 of the invention, wherein the bonding step is performed after the punching step is completed.

Moreover, the invention recited in claim 7 adopts the method for manufacturing a conductive member for a non-contact type data carrier according to claim 4 of the invention, wherein the bonding step and the punching step are performed using a cylinder (16).

Moreover, the invention recited in claim 8 adopts the method for manufacturing a conductive member for a non-contact type data carrier according to claim 4 of the invention, wherein the bonding step and the punching step are performed using a flat plate (21).

Moreover, the invention recited in claim 9 adopts a device for manufacturing a conductive member for a non-contact type data carrier, comprising: bonding means (19) for laminating a conductive layer (6) on which a thermoplastic bonding agent layer (5) is formed from the thermoplastic bonding agent side, while traveling the base material (4), and heating and bonding the conductive layer in a predetermined pattern; punching means (18) in which the conductive layer (6) is punched in the predetermined pattern on the base material (4).

Moreover, the invention recited in claim 10 adopts the device for manufacturing a conductive member for a non-contact type data carrier according to claim 9 of the invention, wherein one cylinder (16) or one flat plate (21) has both of bonding means (19) and punching means (18).

Moreover, the invention recited in claim 11 adopts the non-contact type data carrier according to claim 1 of the invention, wherein an interposer (3) is electrically connected to an antenna (2) as a conductive member for the non-contact type data carrier.

Moreover, the invention recited in claim 12 adopts the non-contact type data carrier according to claim 1 of the invention, wherein a bridge (24) and an IC chip (8) are electrically connected to an antenna (2) as a conductive member for the non-contact type data carrier.

Moreover, the invention recited in claim 13 adopts the method for manufacturing a conductive member for a non-contact type data carrier according to claim 4 of the invention, wherein a laminated body of the conductive layer (6) and the base material (4) is pressed through a cushioned material during the bonding process or the punching process.

Moreover, the invention recited in claim 14 adopts the device for manufacturing a conductive member for a non-contact type data carrier according to claim 9 of the invention, wherein the bonding means (19) or the punching means (18) has a cushioned pressing body (29) which presses a laminated body of the conductive layer (6) and the base material (4).

Moreover, the invention recited in claim 15 adopts the method for manufacturing a conductive member for a non-contact type data carrier according to claim 4 of the invention, further comprising a separating process during which an unnecessary portion (6*b*) of the conductive layer (6) is separated from the base material (4).

Moreover, the invention recited in claim 16 adopts the method for manufacturing a conductive member for a non-contact type data carrier according to claim 15 of the invention, further comprising a hot pressing process during which a laminated body of the conductive layer (6) and the base material (4) is pressed under heating after the separating process.

Moreover, the invention recited in claim 17 adopts the device for manufacturing a conductive member for a non-contact type data carrier according to claim 9 of the invention, further comprising separating means (20*a*) by which an unnecessary portion (6*b*) of the conductive layer (6) is separated from the base material (4).

Moreover, the invention recited in claim 18 adopts the device for manufacturing a conductive member for a non-contact type data carrier according to claim 17 of the invention, comprising hot pressing means (30, 31) by which a laminated body of the conductive layer (6) and the base material (4) is pressed under heating after the unnecessary portion (6*b*) of the conductive layer (6) is removed.

Moreover, the invention recited in claim 19 adopts the method for manufacturing a conductive member for a non-contact type data carrier according to claim 15 of the invention, wherein the unnecessary portion (6*b*) is separated from the base material (4) by ejecting gas to between the unnecessary portion (6*b*) of the conductive layer (6) and the base material (4) under sucking the unnecessary portion (6*b*).

Moreover, the invention recited in claim 20 adopts the device for manufacturing a conductive member for a non-contact type data carrier according to claim 17 of the invention, wherein the separating means which separates the unnecessary portion (6*b*) of the conductive layer (6) from the base material (4) has sucking means (39) which sucks the unnecessary portion (6*b*) of the conductive layer (6), and a nozzle (40) which ejects gas to between the unnecessary portion (6*b*) of the conductive layer (6) and the base material (4).

According to claim 1 of the invention, a conductive member for a non-contact type data carrier has a configuration in which a bonding agent layer (5, 32) is formed on a base material (4) in a predetermined pattern, and a conductive layer (6) comprising metal foil or alloy foil with an approximately similar pattern to said pattern is bonded to the surface of the bonding agent layer (5, 32). Accordingly, the bonding agent layer (5, 32) is prevented from squeezing out from the lower side of the conductive layer (6). The pattern forming may be performed by, for example, coating.

According to claim 2 of the invention, the conductive member for a non-contact type data carrier according to claim 1 of the invention has a configuration in which a slit (7) cutting the conductive layer (6) is formed on the base material (4) along the outline of the conductive layer (6). Accordingly, the pattern of the conductive layer (6) is neatly formed by the slit (7) to improve the electric performance of the conductive layer (6).

According to claim 3 of the invention, the conductive member for a non-contact type data carrier according to claim 1 or 2 of the invention has a configuration in which the surface of the conductive layer (6) is covered with a protective layer (28). Accordingly, the conductive layer (6) is prevented from being oxidized, being scratched and the like.

According to claim 4 of the invention, a method for manufacturing a conductive member for a non-contact type data carrier comprises: a bonding process during which, while a base material (4) is run, a conductive layer (6) on the surface of which a thermoplastic bonding agent layer (5) is formed is laminated on the base material (4) through the side of the thermoplastic bonding agent layer (5) for heating and bonding in a predetermined pattern; and a punching process during which the conductive layer (6) is punched in the pattern on the base material (4). Accordingly, a printing machine, a coating device and the like as a device for forming a pattern may be separated from equipment for manufacturing a conductive member for a non-contact type data carrier by using a conductive layer on which a thermoplastic bonding layer is formed beforehand so as to simplify the equipment for manufacturing a conductive member for an on-contact type data carrier and reduce the cost. Moreover, as the thermoplastic bonding layer may be formed on the whole surface on the side of the conductive layer, position adjustment between the conductive layer and a heating mold is not required during the heating and bonding process to simplify equipment for manufacturing a conductive member for a non-contact type data carrier.

According to claim 5 of the invention the method for manufacturing a conductive member for a non-contact type data carrier according to claim 4 of the invention has a configuration in which the punching process is performed after the bonding process is completed. Accordingly, punching may be performed after the conductive layer (6) is fixed on the base material (4) to prevent a deviation of the conductive layer (6) from the base material (4) which may have caused during punching.

According to claim 6 of the invention, the method for manufacturing a conductive member for a non-contact type data carrier according to claim 4 of the invention has a configuration in which the bonding process is performed after the punching process is completed. Accordingly, "a deformation of the base material" and "a wrinkle of the conductive layer", which are generated during the punching process, are completely removed by hot pressing during the subsequent heating and bonding process to improve the contacting and bonding properties to the base material, enhance the durability, and stabilize the electric performance.

According to claim 7 of the invention, the method for manufacturing a conductive member for a non-contact type data carrier according to claim 4 of the invention has a configuration in which the bonding process and the punching process are performed using a cylinder (16). Accordingly, the manufacturing speed of the conductive member for the non-contact type data carrier may be increased. The cylinder (16) may be used as a rotary die.

According to claim 8 of the invention, the method for manufacturing a conductive member for a non-contact type data carrier according to claim 4 of the invention has a configuration in which the bonding process and the punching process are performed using a flat plate (21). Accordingly, the punching pattern of the conductive layer (6) during the punching process may be simply changed. A flat blade knife of a flat press machine may be used as the flat plate (21).

According to claim 9 of the invention, a device for manufacturing a conductive member for a non-contact type data carrier comprises: bonding means (19) for laminating the conductive layer (6) on which the thermoplastic bonding agent layer (5) is formed on the base material (4) from the thermoplastic bonding agent side, while traveling the base material (4) and heating and bonding the conductive layer (6) in a predetermined pattern; and punching means (18) by which the conductive layer (6) is punched in the above-described pattern on the base material (4). Accordingly, a printing machine, a coating device and the like as a device for forming a pattern may be separated from equipment for manufacturing a conductive member for a non-contact type data carrier by using a conductive layer on which a thermoplastic bonding layer is formed beforehand to simplify the equipment for manufacturing a conductive member for a non-contact type data carrier and to reduce the cost. Moreover, as the thermoplastic bonding layer may be formed on the whole surface on the side of the conductive layer, position adjustment between the conductive layer and a heating mold is not required during the heating and bonding process to simplify equipment for manufacturing a conductive member for a non-contact type data carrier.

According to claim 10 of the invention, the device for manufacturing a conductive member for a non-contact type data carrier according to claim 9 of the invention has a configuration in which one cylinder (16) or one flat plate (21) has both of bonding means (19) and punching means (18). Accordingly, bonding and punching may be performed at the same place to make the manufacturing device compact, and thereby, to reduce the installation space.

According to claim 11 of the invention, the non-contact type data carrier according to claim 1 of the invention has a configuration in which an interposer (3) is electrically connected to an antenna (2) as a conductive member for a non-contact type data carrier. Accordingly, a wireless tag and the like may be configured to have excellent electric performances.

According to claim 12 of the invention, the non-contact type data carrier according to claim 1 of the invention has a configuration in which a bridge (24) and an IC chip (8) are electrically connected to an antenna (2) as a conductive member for a non-contact type data carrier. Accordingly, a wireless tag and the like may be configured to have excellent electric performances.

According to claim 13 of the invention, the method for manufacturing a conductive member for a non-contact type data carrier according to claim 4 of the invention has a configuration in which a laminated body of the conductive layer (6) and the base material (4) is pressed through a cushioned material during the bonding process or the punching process. Accordingly, at bonding or punching, a uniform pressure may be applied to the laminated body of the conductive layer (6) and the base material (4) to form the conductive layer (6) with an appropriate pattern on the base material (4).

According to claim 14 of the invention, the device for manufacturing a conductive member for a non-contact type data carrier according to claim 9 of the invention has a configuration in which the bonding means (19) or the punching means (18) has a cushioned pressing body (29) which presses a laminated body of the conductive layer (6) and the base material (4). Accordingly, at bonding or punching, a uniform pressure may be applied to the laminated body of the conductive layer (6) and the base material (4) to form the conductive layer (6) with an appropriate pattern on the base material (4).

According to claim 15 of the invention, the method for manufacturing a conductive member for a non-contact type data carrier according to claim 4 of the invention further comprises a separating process during which an unnecessary portion (6b) of the conductive layer (6) is separated from the base material (4). Accordingly, the unnecessary portion (6b) of the conductive layer (6) may be separated just after the conductive layer (6) is punched in a predetermined pattern on the base material (4) to simply and quickly produce the conductive member for a non-contact type data carrier.

According to claim 16 of the invention, the method for manufacturing a conductive member for a non-contact type data carrier according to claim 15 of the invention further comprises a hot pressing process during which a laminated body of the conductive layer (6) and the base material (4) is pressed under heating after the separating process. Accordingly, the pattern of the conductive layer (6) is smoothly bonded to the whole surface of the base material (4) even when air bubbles and the like exist between the conductive layer (6) and the base material (4), the edge of the pattern of the conductive layer (6) is curled from the base material (4), and the surface of the conductive layer (6) has a wavy surface after the pattern is punched. Therefore, the characteristics of the antenna and the like may be improved. Moreover, the pattern of the conductive layer (6) may be buried in the base material (4) by, for example, adjustment of the pressing force, but, in that case, the pattern of the conductive layer (6) is adequately protected.

According to claim 17 of the invention, the device for manufacturing a conductive member for a non-contact type data carrier according to claim 9 of the invention further comprises separating means (20a) by which an unnecessary portion (6b) of the conductive layer (6) is separated from the base material (4). Accordingly, the unnecessary portion (6b) of the conductive layer (6) may be separated just after the conductive layer (6) is punched in a predetermined pattern on the base material (4) to simply and quickly produce the conductive member for a non-contact type data carrier.

According to claim 18 of the invention, the device for manufacturing a conductive member for a non-contact type data carrier according to claim 17 of the invention has hot pressing means (30, 31) by which a laminated body of the conductive layer (6) and the base material (4) is pressed under heating after the unnecessary portion (6b) of the conductive layer (6) is removed. Accordingly, the pattern of the conductive layer (6) is smoothly bonded to the whole surface of the base material (4) by the hot pressing means (30, 31), even when air bubbles and the like exist between the conductive layer (6) and the base material (4), the edge of the pattern of the conductive layer (6) is curled from the base material (4), and the surface of the conductive layer (6) has a wavy surface after the pattern is punched. Therefore, the characteristics of the antenna and the like may be improved. Moreover, the pattern of the conductive layer (6) may be buried in the base material (4) by, for example, adjustment of the pressing force of the hot pressing means (30, 31), but, in that case, the pattern of the conductive layer (6) is adequately protected.

According to claim 19 of the invention, the method for manufacturing a conductive member for a non-contact type data carrier according to claim 15 of the invention has a configuration in which the unnecessary portion (6b) is separated from the base material (4) by shooting gas to between the unnecessary portion (6b) and the base material (4) under sucking the unnecessary portion (6b) of the conductive layer (6). Accordingly, the unnecessary portion (6b) of the conductive layer (6) may be smoothly removed.

According to claim 20 of the invention, the device for manufacturing a conductive member for a non-contact type data carrier according to claim 17 of the invention has a configuration in which the separating means which separates the unnecessary portion (6b) of the conductive layer (6) from the base material (4) has sucking means (39) which sucks the unnecessary portion (6b) of the conductive layer (6), and a nozzle (40) which shoots gas to between the unnecessary portion (6b) of the conductive layer (6) and the base material (4). Accordingly, it is obvious that the unnecessary portion (6b) of the conductive layer (6) may be smoothly removed, and the device structure for separating may be simplified.

Figure 1:
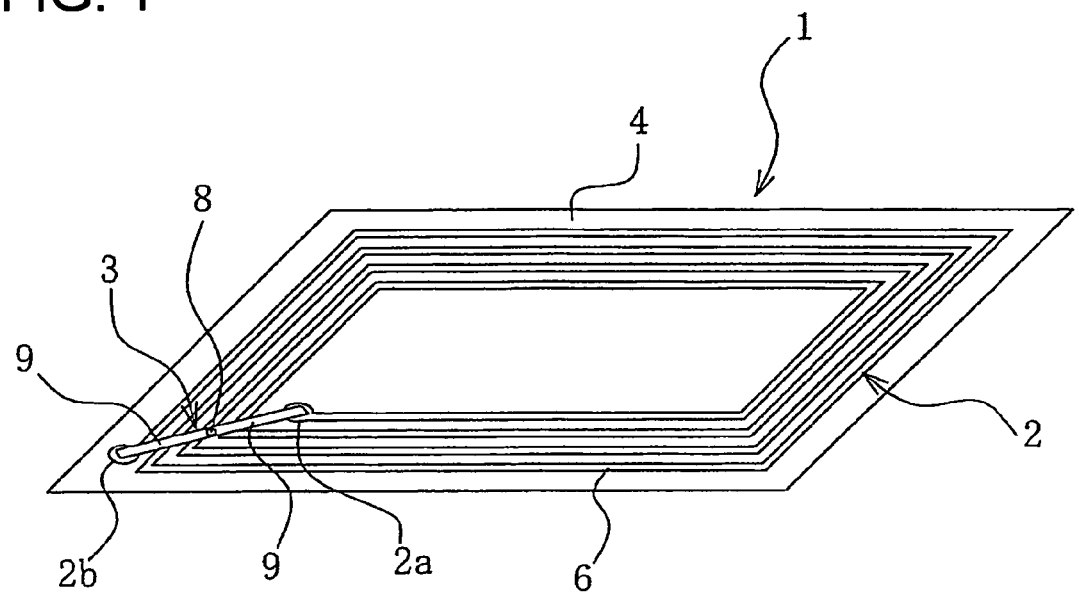
FIG. 1 is a perspective and schematic view showing a wireless tag according to the present invention, wherein the tag is made, using an antenna and an interposer.

EXPLANATION OF REFERENCE NUMERALS 2 antenna
4 base material 4a continuous body of base material
5 thermoplastic bonding agent layer
6 conductive layer
6a continuous body of conductive layer
6b unnecessary portion of conductive layer
7 slit
8 IC chip
13 ink jet nozzle
15 guide roller
16 cylinder
18 punching blades
19 transfer body
20a, 20b Separating rollers
21 flat plate
24 bridge
28 protective layer
29 cushioned pressing body
30 heating roller
31 pressing roller
32 UV or EB curable bonding agent layer
33 UV or EB applying device
39 sucking tube
40 nozzle

BEST MODE OF CARRYING OUT THE INVENTION

Hereinafter, the best modes of carrying out the invention will be explained, referring to drawings.

Embodiment 1

Figure 2:
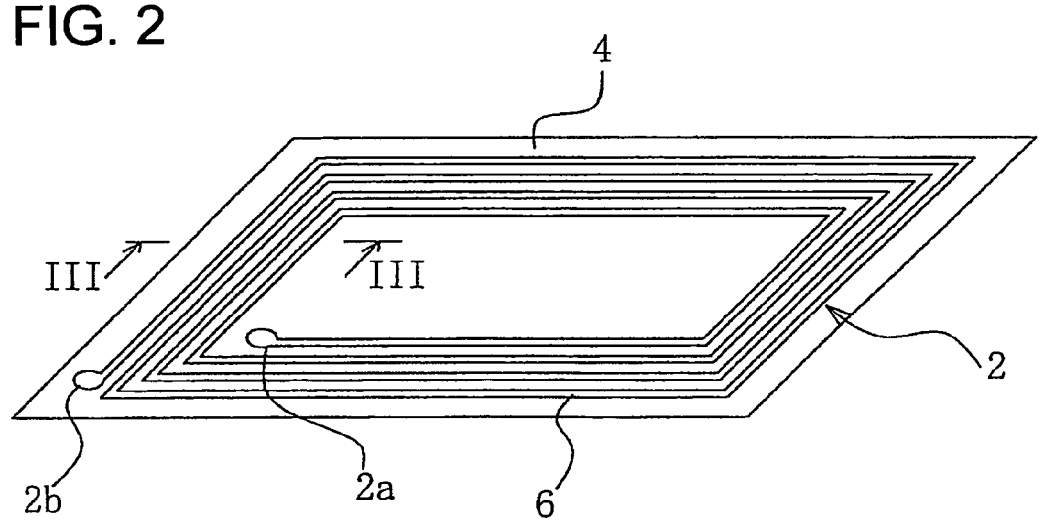
FIG. 2 is a perspective and schematic view showing the antenna according to the present invention.
Figure 4:
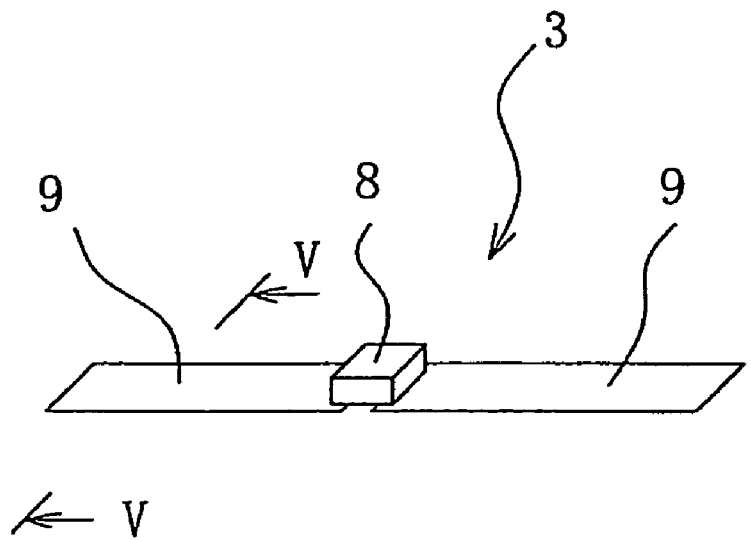
FIG. 4 is a perspective and schematic view showing an interposer according to the present invention.

A wireless tag 1 shown in FIG. 1 is made, using an antenna 2 as a conductive member as shown in FIG. 2 for a non-contact type data carrier and an interposer 3 as shown in FIG. 4 as a conductive member for a non-contact type data carrier. As shown in FIG. 1, the ends 2a and 2b of the antenna 2 are electrically connected to each other through the interposer 3, and the surface of the whole of the wireless tag 1 is covered with a not-shown protective layer such as a resin film.

Figure 3A:
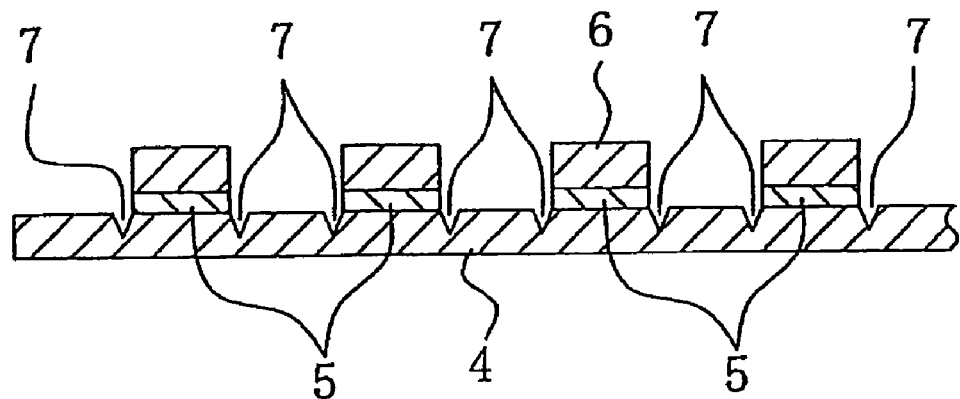
FIG. 3(A) is a cross sectional view taken along the line III-III of FIG. 2.

The antenna 2 has a layer configuration as shown in FIG. 3(A). That is, a thermoplastic bonding agent layer 5 is printed on a sheet-like base material 4 made of paper, resin and the like in the same pattern as a spiral pattern of the antenna 2, and a conductive layer 6 comprising metal foil of aluminum, copper, copper alloy, phosphor bronze, SUS and the like or alloy foil is heated and bonded to the above thermoplastic bonding agent layer 5 in the spiral pattern of the antenna 2. Here, the antenna has, in addition to the spiral pattern, various kinds of patterns such as a bar-like one, a pad-like one, and a cross-like one, depending on communication frequency bands. The thermoplastic bonding agent layer 5 is applied on the pattern of the antenna 2 according to printing methods such as ink jet printing, gravure printing, flexo printing, screen printing and the like. As thermoplastic bonding agent layer 5 is formed on the base material 4 according to the above printing method as described above, the conductive layer 6 is formed on the base material 4 without large bulges, and thermoplastic bonding agent is prevented from squeezing out from the lower side of the conductive layer 6.

Moreover, a slit 7 is formed on the base material 4 so that the conductive layer 6 is cut along the pattern of the antenna 2, that is, the outline of the conductive layer 6 as shown in FIG. 3(A). With regard to the conductive layer 6, the outline of the pattern is neatly formed by the above slit 7 to improve the electric performance of the conductive layer 6.

Figure 3B:
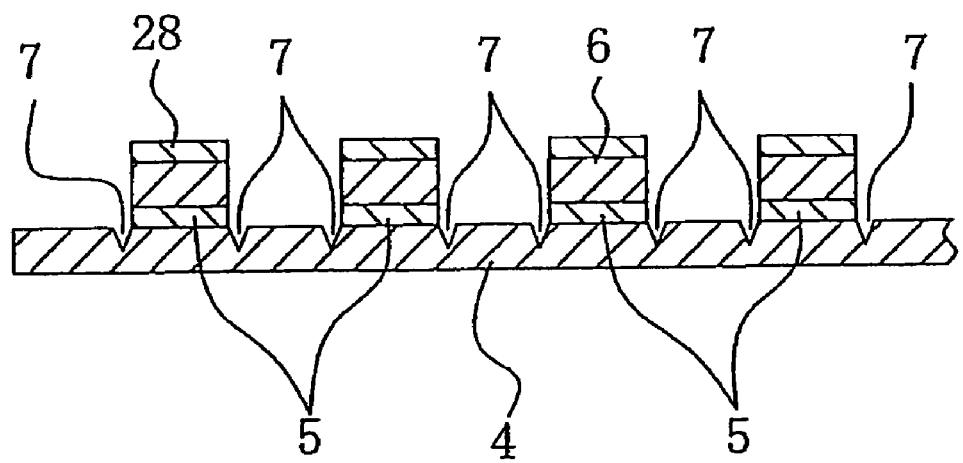
FIG. 3(B) is a cross sectional view similar to FIG. 3(A) when a protective layer is added in FIG. 2.

Here, the surface of the conductive layer 6 is covered with a protective layer 28 as required as shown in FIG. 3(B) to protect the surface from being oxidized, being scratched and the like. Resin and the like are used as the protective layer 28.

Figure 5:
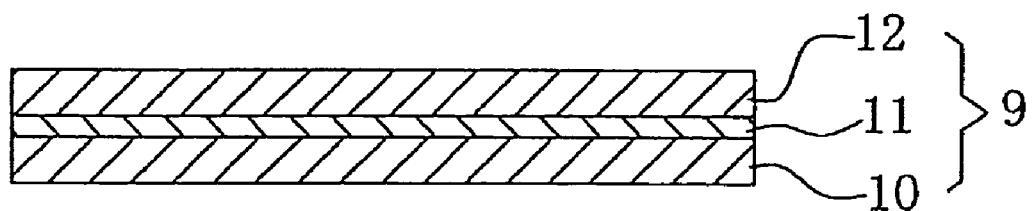
FIG. 5 is a cross sectional view taken along the line V-V of FIG. 4.

The interposer 3 has a configuration in which, as shown in FIG. 4, conductive sheets 9 and 9 with a rectangular shape are electrically connected to electrodes (not shown) of the both sides of an IC chip 8, and the conductive sheets 9 and 9 on the both sides are bonded to the end portions 2a and 2b of the antenna 2 with a conductive bonding agent and the like as shown in FIG. 1. As shown in FIG. 5, the conductive sheets 9 and 9 have a similar layer configuration as that of the antenna 2. According to the layer configuration, a conductive layer 12 comprising metal foil of aluminum, copper, copper alloy, phosphor bronze, SUS and the like, or alloy foil of is formed, through a bonding agent layer 11, on a base material 10 with a comparatively thinner thickness than that of the base material 4 of the antenna 2 by bonding or laminating. Moreover, the conductive layer 12 is bonded to the base material 10 through a thermoplastic bonding agent layer in some cases in a similar manner to that of the antenna 2. The interposer 3 may be manufactured according to a different method from the above-described manufacturing method, wherein the different method, for example, uses conductive ink.

When the wireless tag 1 with the above-described configuration is used, reading or writing of various kinds of information in the IC chip 8 is performed by a reading and writing apparatus (not shown) in the electromagnetic field.

Subsequently, a method and a device for manufacturing the antenna 2 will be explained, referring to FIG. 6.

(1) First, a continuous body 4a of a base material 4 and a continuos body 6a of metal foil as a conductive layer 6 are prepared, and both the continuous bodies 4a and 6a are configured to run at the same speed as each other in the direction of the arrow in the drawing.

(2) An ink jet nozzle 13 is arranged above a running path of the continuous body 4a of the base material 4, and the above ink jet nozzle 13 discharges a liquid thermoplastic bonding agent 5a toward the surface of the continuous body 4a of the base material 4. Thereby, a thermoplastic bonding agent layer 5 is printed on the surface of the continuous body 4a of the base material 4 in the same pattern as that of the antenna 2 at constant intervals.

(3) A drying machine 14 is arranged on the downstream side of the ink jet nozzle 13. The thermoplastic bonding agent layer 5 printed on the surface of the continuous body 4a of the base material 4, and dried by the drying machine 14 after solvents and the like are removed. The drying machine 14 is eliminated, depending on the kinds of the thermoplastic bonding agent 5a used.

(4) Moreover, while the continuous body 6a of the metal foil as the conductive layer 6 is guided by a guide roller 15, the continuous body 6a is laminated on the continuous body 4a of the base material 4 through thermoplastic bonding agent layer 5.

(5) A processing cylinder 16 and a receiving roller 17 are arranged on the downstream side of the guide roller 15 so that the continuous body 4a of the base material 4 and the continuous body 6a of the metal foil as the conductive layer 6 run through between the cylinder 16 and the roller 17.

The processing cylinder 16 is a metal roller with a built-in electric heater which is not shown in the drawing, and punching blades 18 corresponding to the pattern of the antenna 2 are formed on the peripheral surface thereof. The punching blade 18 punches the one pattern of the antenna 2, and, for example, four pairs of the blades 18 are arranged on the peripheral surface of the processing cylinder 16. However, the number of pairs of the blades 18 which are arranged is different, depending on the size of the antenna, the diameter of the processing cylinder and the like. A heat transfer body 19 is inserted between the blades for the pattern portion of the punching blade 18. Preferably, the heat transfer body 19 is made of materials with a cushion performance such as rubber, and heat-resistant resin. Moreover, a portion corresponding to the heat transfer body 19 may be also formed of the same material as that of the punching blade 18. Moreover, the receiving roller 17 is formed with a metal roller. A gap between the roller 17 and the processing cylinder 16 may be adjusted according to the thickness of the base material 4, for example, by changing the position of the above metal roll. A rotary die may be used as the above processing cylinder 16.

The continuous body 4a of the base material 4 and the continuous body 6a of the metal foil as the conductive layer 6 are drawn into between the processing cylinder 16 and the receiving roller 17 while the bodies 4a and 6a are laminated on each other, and the metal foil is punched in the pattern of the antenna 2 with the punching blade 18. Moreover, the punched conductive layer 6 with the pattern of the antenna 2 is pressed by the heat transfer body 19 to thermoplastic bonding agent layer 5 which has the same pattern as that of the antenna 2, and is positioned on the continuous body 4a of the base material 4. On this occasion, thermoplastic bonding agent layer 5 melts by heat transferred from the heat transfer body 19, and the conductive layer 6 is bonded to the continuous body 4a of the base material, using the above melted thermoplastic bonding agent layer 5. As the bonding process and the punching process for the conductive layer 6 are simultaneously performed as described above, the antenna 2 is simply and accurately manufactured. Moreover, the manufacturing device is made compact to reduce the installation space.

Moreover, the slit 7 shown in FIG. 3 is formed on the continuous body 4a of the base material 4 along the outline of the antenna 2 by the point of the punching blade 18 which has punched the continuous body 6a of the metal foil as the conductive layer 6. Thereby, the conductive layer 6 is accurately punched according to the pattern of the antenna 2, and the outline of the pattern is neatly formed by the slit 7.

Figure 6:
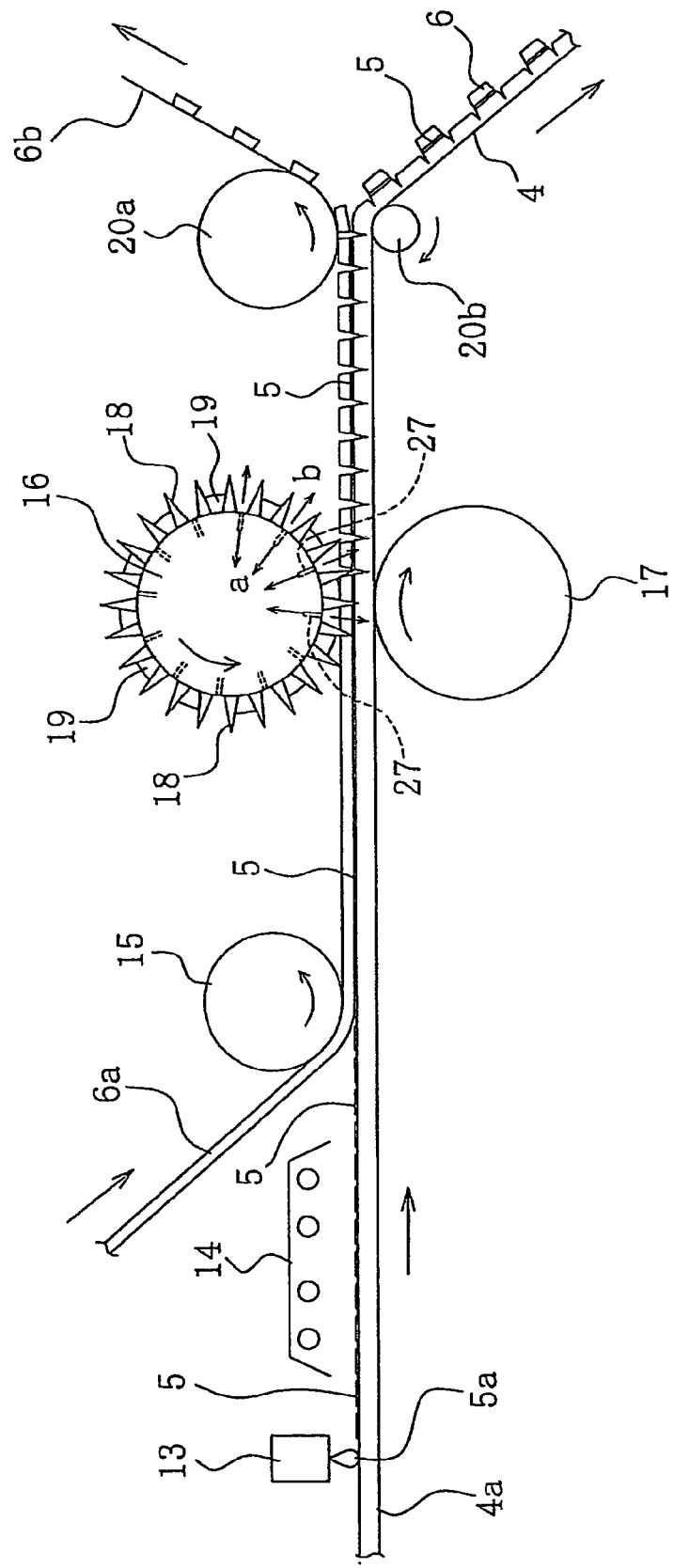
FIG. 6 is a schematic side view showing a device for manufacturing an antenna according to the present invention.

Preferably, air holes 27 are formed, as shown in FIG. 6, at positions corresponding to unnecessary-portions except the heat transfer bodies 19 in the processing cylinder 16. The air hole 27 functions as sucking means for sucking of the unnecessary portion to the side of the punching blade side, and as discharging means which discharges the unnecessary portion from the side of the punching blade after punching. That is, the unnecessary portion is sucked to the side of the punching blade by sucking air from the air hole 27 to the side of the punching blade, that is, in the direction of the arrow a in the drawing when the punching blade 18 punches the conductive layer 6 of metal foil. Thereby, the conductive layer 6 is punched in a more accurate pattern. Moreover, the unnecessary portion is forced out to the outside of the punching blade 18 by blowing air from the air hole 27 in the direction of the arrow b in the drawing after punching. Thereby, the unnecessary portion may be easily collected. Moreover, the unnecessary portion may be prevented from being blocked at a position corresponding to an unnecessary-portion except the heat transfer body 19 in the processing cylinder 16.

Here, the air hole 27 may be switchably connected to a sucking mechanism and a blowing mechanism, which are not shown in the drawing, or an air hole connected to a sucking mechanism, and an air hole connected to a blowing mechanism may be separately provided.

Separating rollers 20a and 20b are provided on the downstream side of the processing cylinder 16, and the continuous body 4a of the base material 4 and the continuous body 6a of the metal foil as the conductive layer 6 are pulled in different directions from each other just after passing through the separating rollers 20a and 20b. Then, the antenna 2 runs in the direction of the arrow in the drawing, being held carried on the continuous body 4a of the base material 4, and the unnecessary portion 6b of metal foil runs in the direction of the arrow in the drawing, being separated from the continuous body 4a of the base material 4.

Thereafter, the continuous body 4a of the base material 4 is divided into each antenna 2 which is provided for manufacturing, for example, the above-described wireless tag.

Here, the conductive sheet 9 with a rectangular shape in the interposer 3 may be also manufactured according to a method and by a device, which are similar to those used for manufacturing the antenna 2.

Embodiment 2

Figure 7:
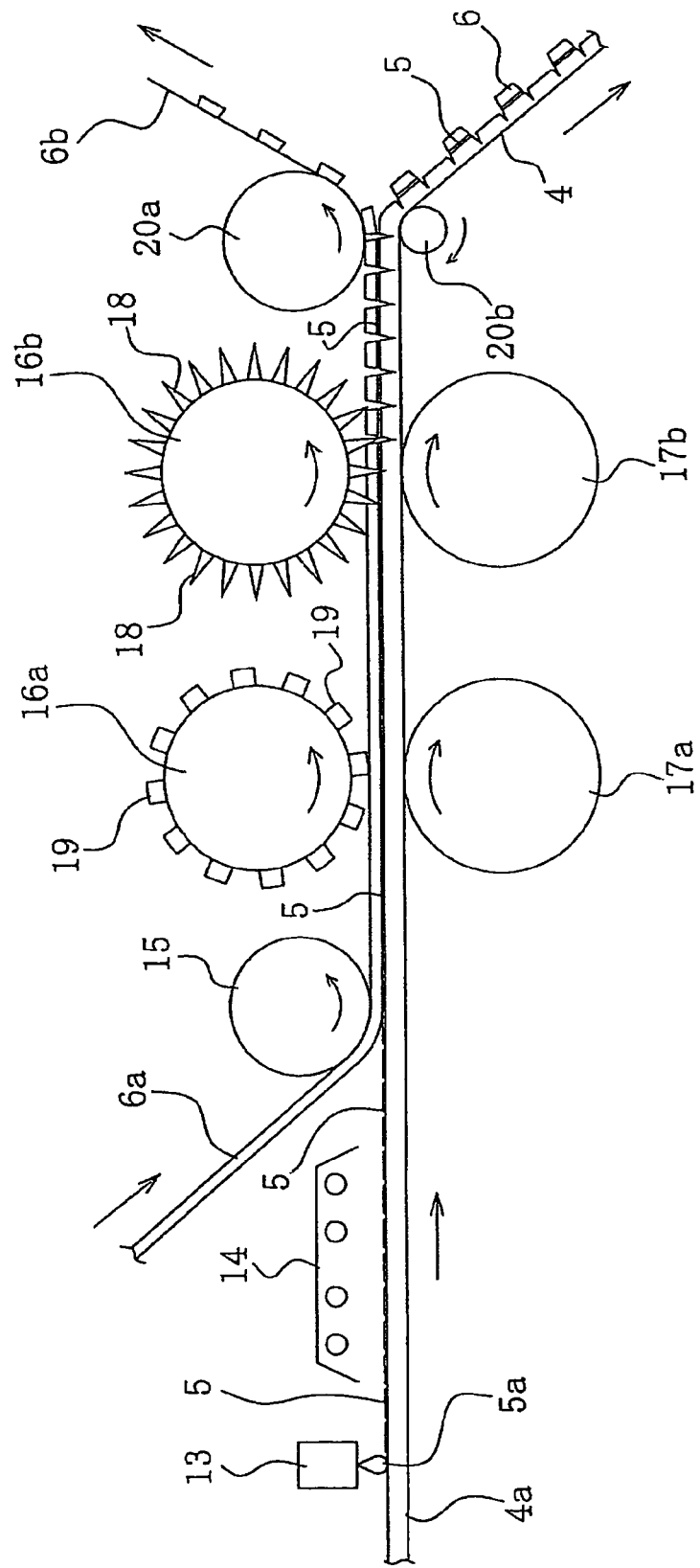
FIG. 7 is a schematic side view showing a device for manufacturing an antenna according to an embodiment 2 of the present invention.

As shown in FIG. 7, the present embodiment 2 has a configuration in which the processing cylinder 16 in the embodiment 1 is separated to two cylinders 16a and 16b, which are arranged along the running direction of a continuous body 4a of a base material 4 and a continuous body 6a of metal foil as a conductive layer 6. The cylinder 16a on the upstream side is a heating cylinder on the peripheral surface of which there are formed heat transfer bodies 19 which are formed in a convex state and has a heating pattern corresponding to the pattern of an antenna 2. The heat transfer body 19 is formed of rubber, heat-resistant resin and the like, which have cushion and heat transfer performances. Moreover, the cylinder 16a may be also made by patterning with a metal roll. The cylinder 16b on the downstream side is a punching cylinder, and punching blades 18 corresponding to the pattern of the antenna 2 are formed on the peripheral surface thereof. The heating cylinder 16a is arranged opposite to a receiving roller 17a, and the punching cylinder 16b is arranged opposite to a receiving roller 17b in a similar manner to that of the receiving roller 17 in the embodiment 1.

The continuous body 4a of the base material 4 and the continuous body 6a of the metal foil as the conductive layer 6 are drawn into between the heating cylinder 16a and the receiving roller 17a while the bodies 4a and 6a are laminated on each other, a thermoplastic bonding agent layer 5, which is printed in the same pattern as that of the antenna 2 on the continuous body 4a of the base material 4, is melted by the pattern of the heat transfer body 19 on the heating cylinder 16a, and the conductive layer 6 of metal foil is pressed on the above melted thermoplastic bonding agent layer 5. Subsequently, the continuous body 4a of the base material 4 and the continuous body 6a of the metal foil as the conductive layer 6 are drawn into between the processing cylinder 16b and the receiving roller 17b while the bodies 4a and 6a are laminated on each other, and the metal foil is punched in the pattern of the antenna 2 with the punching blade 18. Thereafter, the continuous body 4a of the base material 4 and the continuous body 6a of the metal foil as the conductive layer 6 are separated from each other in the same manner as that of the embodiment 1.

Thus, according to the embodiment 2, the metal foil may be punched after the metal foil is fixed on the base material 4 because the punching process is performed after completing the bonding process. Accordingly, a deviation of the conductive layer 6 from the base material 4 may be prevented, which may have occurred during punching.

Here, a conductive sheet 9 of an interposer 3 may be also manufactured according to a method similar to that used for manufacturing the antenna 2.

Embodiment 3

Figure 8:
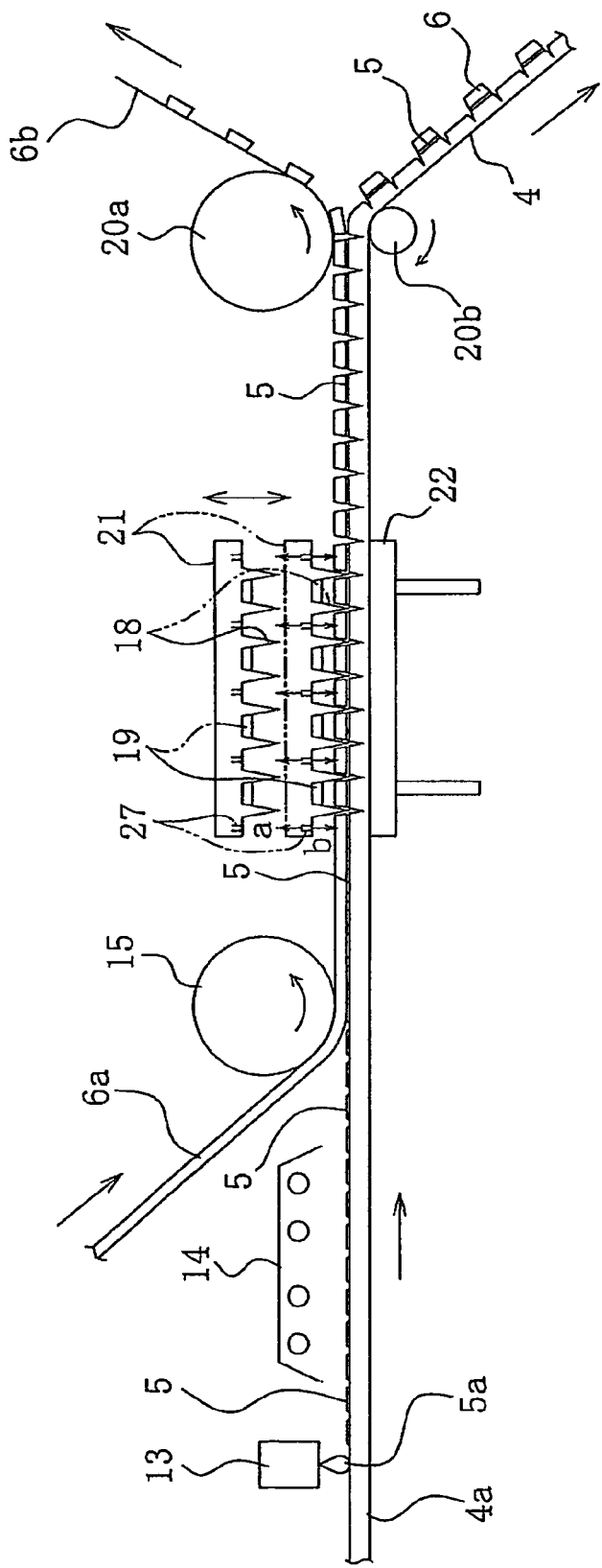
FIG. 8 is a schematic side view showing a device for manufacturing an antenna according to an embodiment 3 of the present invention.
Figure 9:
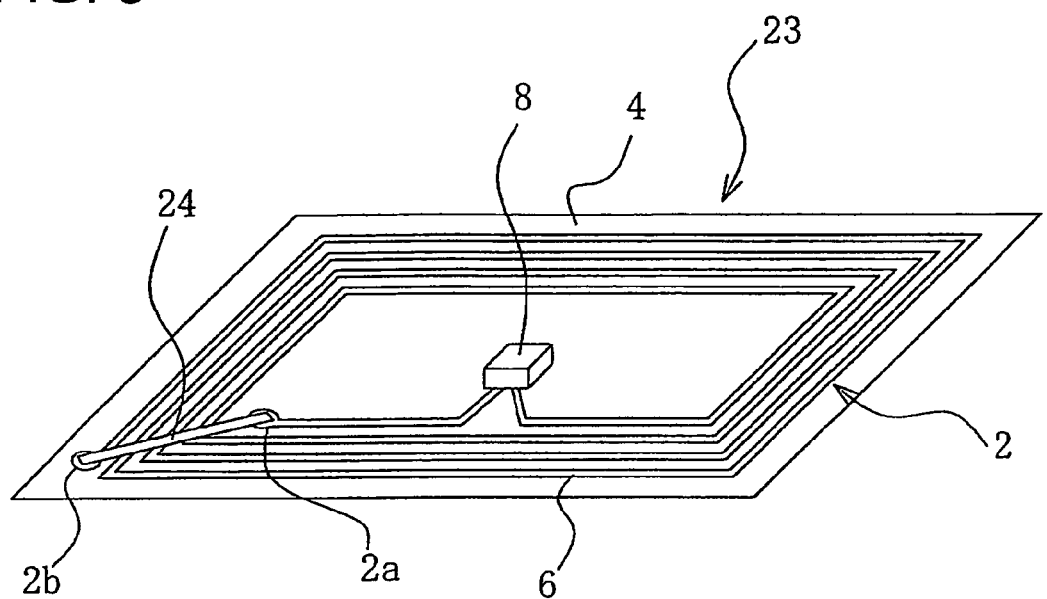
FIG. 9 is a perspective and schematic view showing a wireless tag according to an embodiment 4 of the present invention, wherein the tag is made, using an antenna and a bridge.

The present embodiment 3 has a configuration, different from that of the embodiment 1, in which a flat plate 21 as a flat blade knife of a flat press machine is substituted for the processing cylinder 16, and a pedestal 22 is substituted for the receiving roller 17, as shown in FIG. 8.

In this case, a continuous body 4a of a base material 4 and a continuous body 6a of metal foil as a conductive layer 6 are intermittently fed at a constant pitch to between a processing flat plate 21 and a pedestal 22, and the processing flat plate 21 is reciprocally moved up and down to the pedestal 22. Then, the continuous body 6a of the metal foil as the conductive layer 6 is punched in the pattern of an antenna 2 at each reciprocal movement, and is pressed onto a melted thermoplastic bonding agent layer 5 on the continuous body 4a of the base material 4. Thereafter, the continuous body 4a of the base material 4 and the continuous body 6a of the metal foil as the conductive layer 6 are separated from each other in the same manner as that of the embodiment 1.

Here, there may be applied a configuration, in a similar manner to that of the embodiment 2, in which the processing flat plate 21 is separated to a flat plate for heating and one for punching, and the pedestal 22 is also separated to a pedestal for heating, corresponding to the flat plate for heating, and a pedestal for punching, corresponding to the flat plate for punching.

Moreover, in the same manner as that of the embodiment 1, air holes 27 are formed as required at positions corresponding to unnecessary-portions except heat transfer bodies 19 in the processing flat plate 21. When a punching blade 18 punches the conductive layer 6 of the metal foil, the unnecessary portion is sucked to the side of the punching blade by sucking air from the air hole 27 to the side of the punching blade, that is, in the direction of the arrow a in the drawing. Thereby, the conductive layer 6 is punched in a more accurate pattern. Moreover, the unnecessary portion is forced out to the outside of the punching blade 18 by blowing air from the air hole 27 in the direction of the arrow b in the drawing after punching. Thereby, the unnecessary portion may be easily collected. Moreover, the unnecessary portion may be prevented from being blocked at a position corresponding to an unnecessary-portion except the heat transfer body 19 in the processing cylinder 16.

Here, the air hole 27 may be switchably connected to a sucking mechanism and a blowing mechanism, which are not shown in the drawing, or an air hole connected to a sucking mechanism, and an air hole connected to a blowing mechanism may be separately provided.

Embodiment 4

A wireless tag 23 in the present embodiment 4 has a configuration, different from that of the embodiment 1, in which an IC chip 8 is provided in the middle of an antenna 2 as the conductive member for non-contact type data carrier, a bridge 24 is substituted for the interposer 3, and the ends 2a and 2b of the antenna 2 are electrically connected through the bridge 24. The bridge 24 is formed as a layered body in which conductive layers made of metal foil are, for example, laminated on the base material made of resin film and the like.

Moreover, the above bridge 24 may be also manufactured according to a method similar to that of the embodiment 1 for manufacturing the antenna 2.

Embodiment 5

Figure 10:
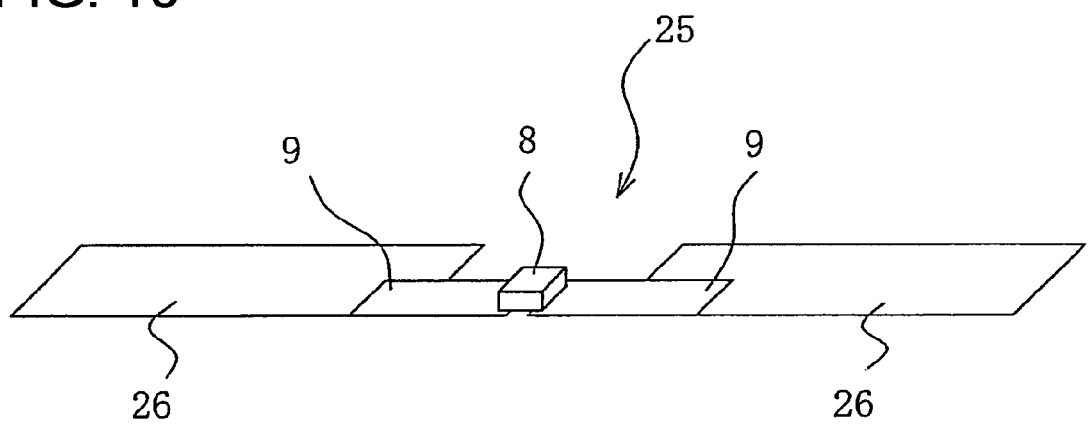
FIG. 10 is a perspective and schematic view showing an interposer with an antenna according to an embodiment 5 of the present invention.

An interposer 25 according to the present embodiment 5 is formed as an interposer with an antenna, as shown in FIG. 10. Antennas 26 and 26 are formed as a layered body in which a conductive layer made of metal foil is laminated on a base material made of resin film and the like through a thermoplastic bonding agent layer. These antennas 26 and 26 are one example of the above-described antenna with a bar-like pattern.

The above antenna 26 may be manufactured according to a method similar to that of the embodiment 1 for manufacturing the antenna.

Embodiment 6

Figure 11:
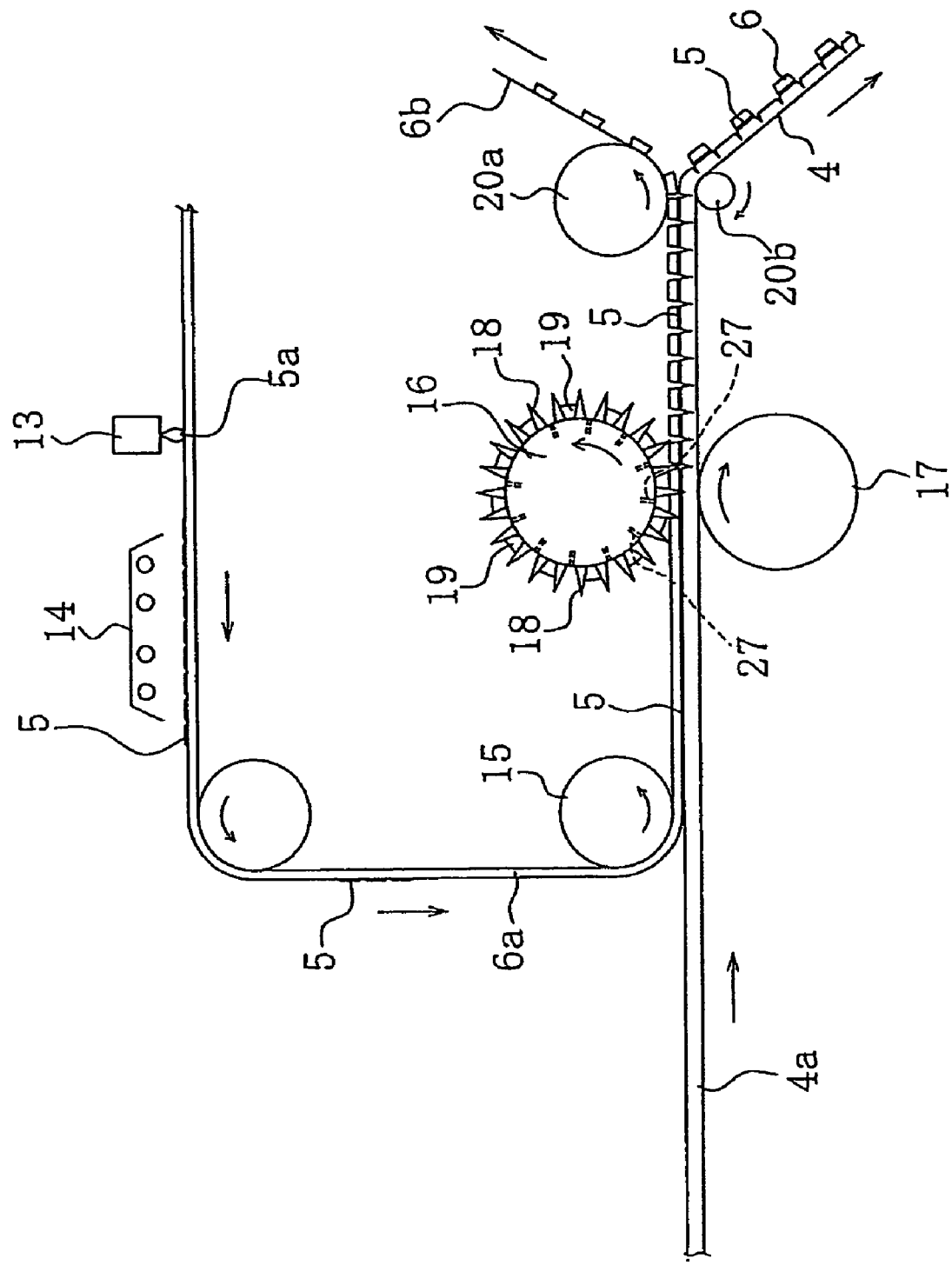
FIG. 11 is a schematic side view showing a device for manufacturing an antenna according to an embodiment 6 of the present invention.

The present embodiment 6 has a configuration, as shown in FIG. 11, in which, while a continuous body 6a of metal foil as a conductive layer 6 is run, a thermoplastic bonding agent layer 5 is printed on the surface of the body 6a in a predetermined pattern with an ink jet nozzle 13, and thermoplastic bonding agent layer 5 is dried with a drying machine 14. At the same time, the continuous body 6a of the conductive layer 6 is configured to be laminated on the continuous body 4a through the side of the thermoplastic bonding agent layer 5, while a continuous body 4a of a base material 4 is run, for heating and bonding.

Here, there may be applied a configuration in which thermoplastic bonding agent layer 5 is printed on the upper surface of the body 6a and is dried while the continuous body 6a of the conductive layer 6 is run in parallel with the continuous body 4a of the base material 4, the inside and outside are reversed with a turn bar, thermoplastic bonding agent layer 5 is made opposed to the continuous body 4a side of the base material 4, and, thereafter, the continuous body 6a of the conductive layer 6 is laminated on the continuous body 4a of the base material 4 through the side of the thermoplastic bonding agent layer 5 for heating and bonding.

Embodiment 7

Figure 12:
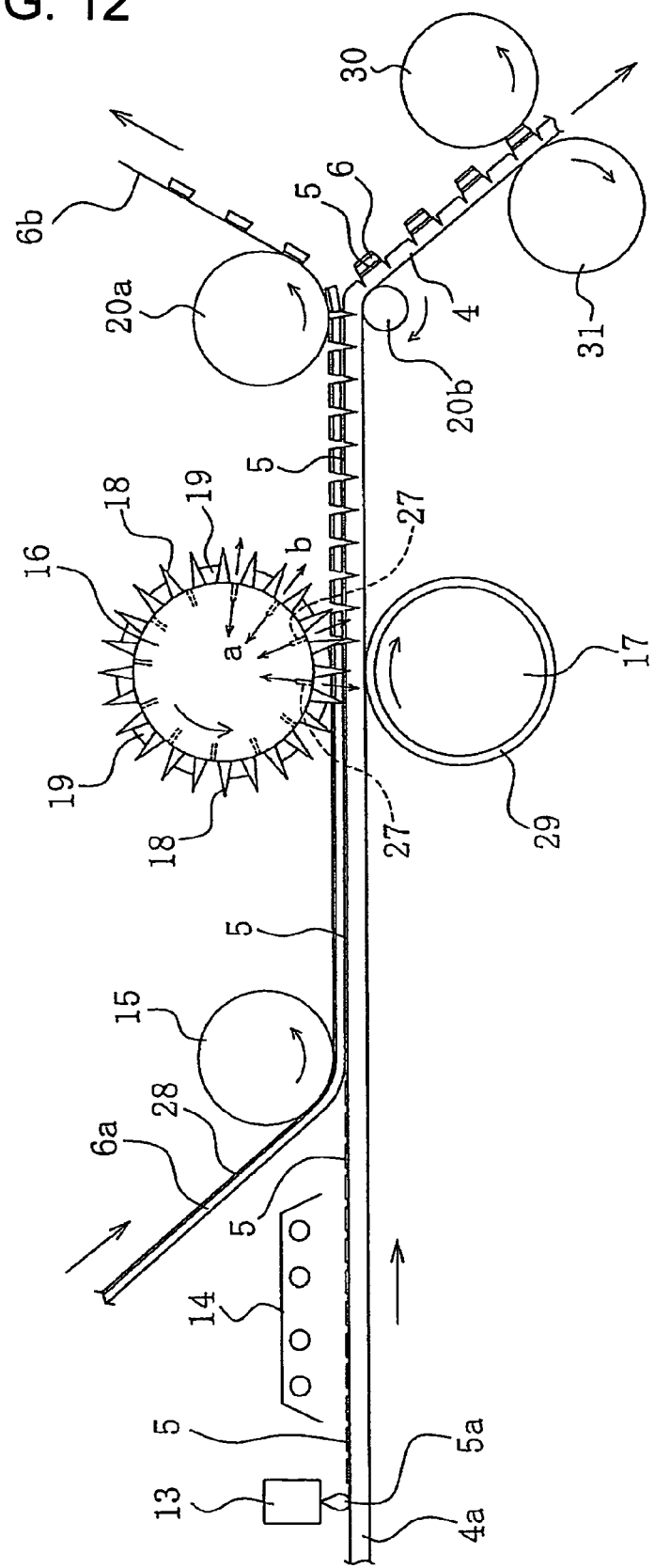
FIG. 12 is a schematic side view showing a device for manufacturing an antenna according to an embodiment 7 of the present invention.

As shown in FIG. 12, a device for manufacturing a conductive member for a non-contact type data carrier according to the present embodiment 7 has a configuration, different from that of the embodiment 1 shown in FIG. 6, in which, when bonding and punching are performed for a laminated body of a continuous body 6a of metal foil as a conductive layer 6 and a continuous body 4a of a base material 4, the laminated body is pressed through a cushioned material. Specifically, a cushioned pressing body 29 such as a rubber sheet is wrapped around the peripheral surface of a receiving roller 17 opposing to a processing cylinder 16. Thereby, a uniform pressure is applied to the laminated body when the body passes through between the processing cylinder 16 and the receiving roller 17, and the conductive layer 6 is accurately punched on the base material 4, and, at the same time, is appropriately bonded to the base material 4.

Moreover, after an unnecessary portion 6b of the conductive layer 6 is removed at separating rollers 20a and 20b on the downstream side of the processing cylinder 16, the continuous body 4a of the base material 4 is pressed in the downstream side, being kept heated. Specifically, hot pressing is performed with a heating roller 30 and a pressing roller 31.

Thereby, the pattern of the conductive layer 6 is smoothly bonded to the whole surface of the base material 4 even when air bubbles and the like exist between the conductive layer 6 and the base material 4, the edge of the pattern is curled from the base material 4, and the surface of the conductive layer 6 has a wavy surface after the pattern is punched.

Figure 24:
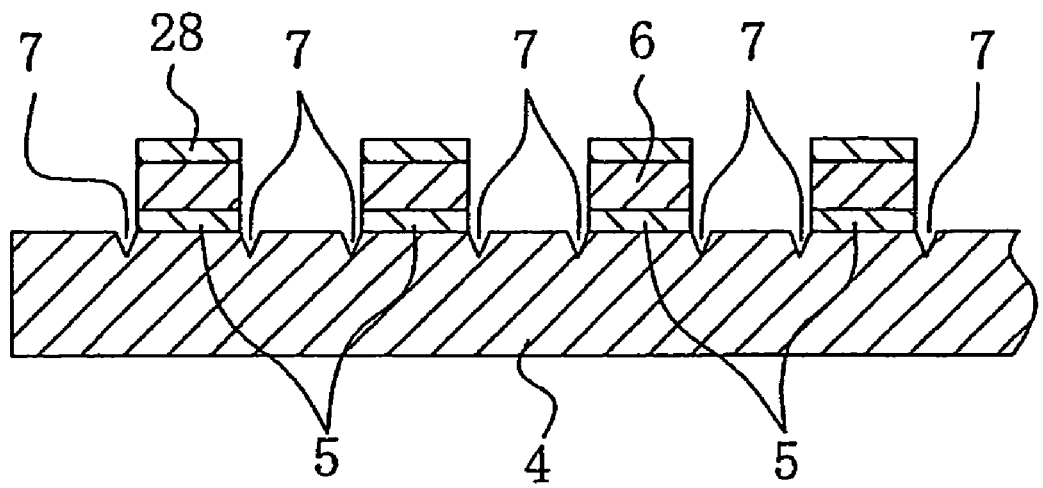
FIG. 24 is a cross sectional view of an antenna which is manufactured by the device for manufacturing an antenna according to the embodiment 7 of the present invention, wherein the antenna is in a state before hot pressing.
Figure 25:
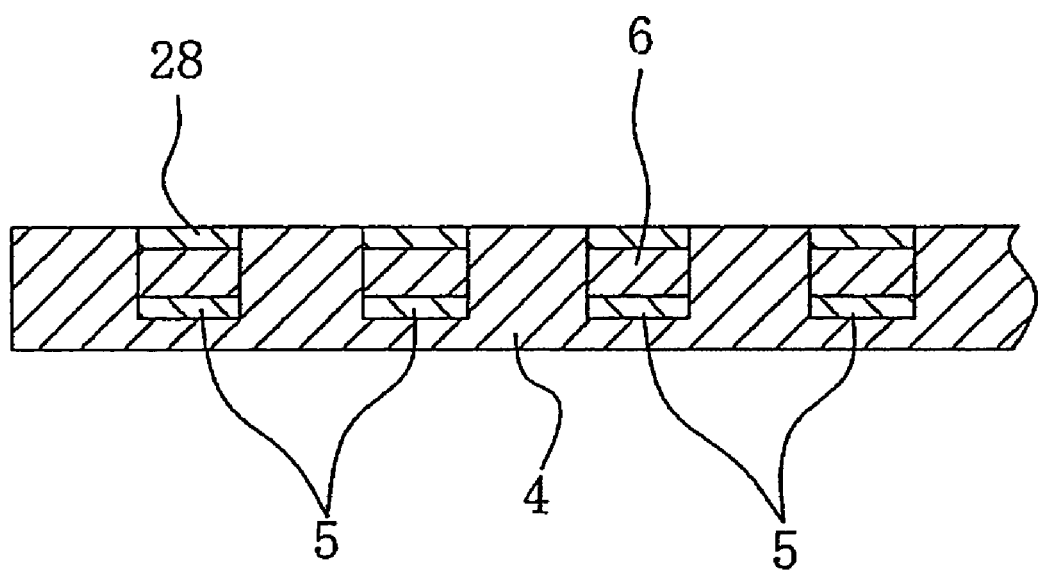
FIG. 25 is a cross sectional view of the antenna which is manufactured by the device for manufacturing an antenna according to the embodiment 7 of the present invention, wherein the antenna is in a state after hot pressing.

By adjusting the pressing force, the heating temperature and the like given to the base material 4 with the heating roller 30 and the pressing roller 31 during the above hot pressing, the pattern of the conductive layer 6 may be bonded to the base material 4 in a state in which the pattern is protruding from the material 4 as shown in FIG. 24, or in a state in which the pattern is buried in the softened material 4 as shown in FIG. 25. In the latter case, the whole surface of the base material 4 become smooth to more adequately protect the pattern of the conductive layer 6 from, for example, being worn away. Moreover, slits 7 almost disappear in this case, too.

Here, a body covered with a protective layer 28 made of resin is used as the continuous body 6a of the conductive layer 6 as shown in FIG. 12. By the existence of the above protective layer 28, the conductive layer 6 is protected from being oxidized, being scratched and the like during manufacturing the conductive member for an on-contact type data carrier. The above protective layer 28 is provided as required, and may be eliminated.

Furthermore, portions similar to those in FIG. 6 are denoted by the same reference numbers in FIG. 12 as those in FIG. 6, and duplicated description will be eliminated.

Embodiment 8

Figure 13:
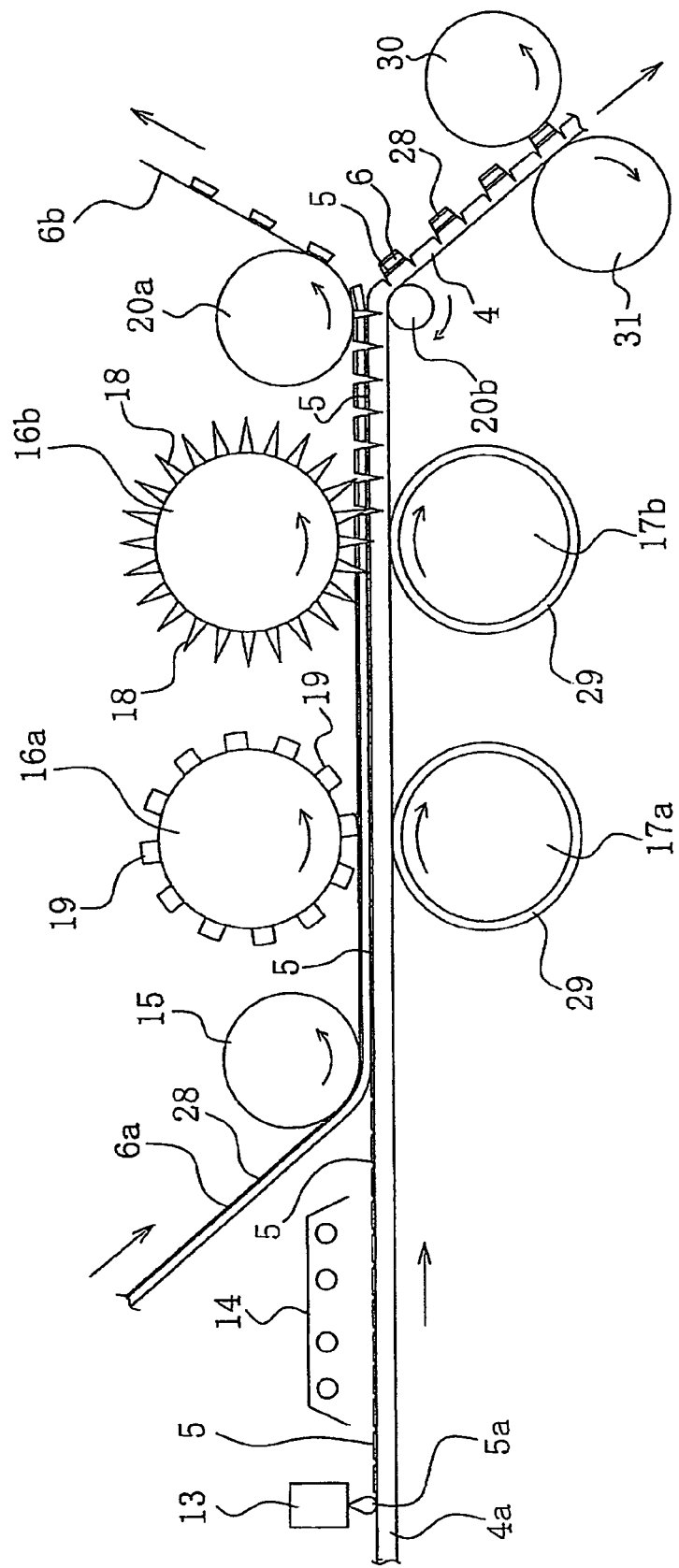
FIG. 13 is a schematic side view showing a device for manufacturing an antenna according to an embodiment 8 of the present invention.

As shown in FIG. 13, the present embodiment 8 has a configuration in which the processing cylinder 16 in the embodiment 7 is separated to two cylinders 16a and 16b, which are arranged along the running direction of a continuous body 4a of a base material 4 and a continuous body 6a of metal foil as a conductive layer 6.

Moreover, a cushioned pressing body 29 such as a rubber sheet is wrapped on the peripheral surface of a receiving roller 17a opposing to a processing cylinder 16a, and on the peripheral surface of a receiving roller 17b opposing to a processing cylinder 16b. Thereby, a uniform pressure is applied to the layered body of the continuous body 6a of the conductive layer 6 and the continuous body 4a of the base material 4 and a thermoplastic bonding agent layer 5 is uniformly melted when the laminated body passes through between the processing cylinders 16a and the receiving roller 17a and through between the processing cylinders 16b and the receiving roller 17b. Accordingly, the conductive layer 6 is accurately punched on the base material 4, and is appropriately bonded to the base material 4.

Furthermore, portions similar to those in FIG. 12 and FIG. 7 are denoted by the same reference numbers in FIG. 13 as those in FIG. 12 and FIG. 7, and duplicated description will be eliminated.

Embodiment 9

Figure 14:
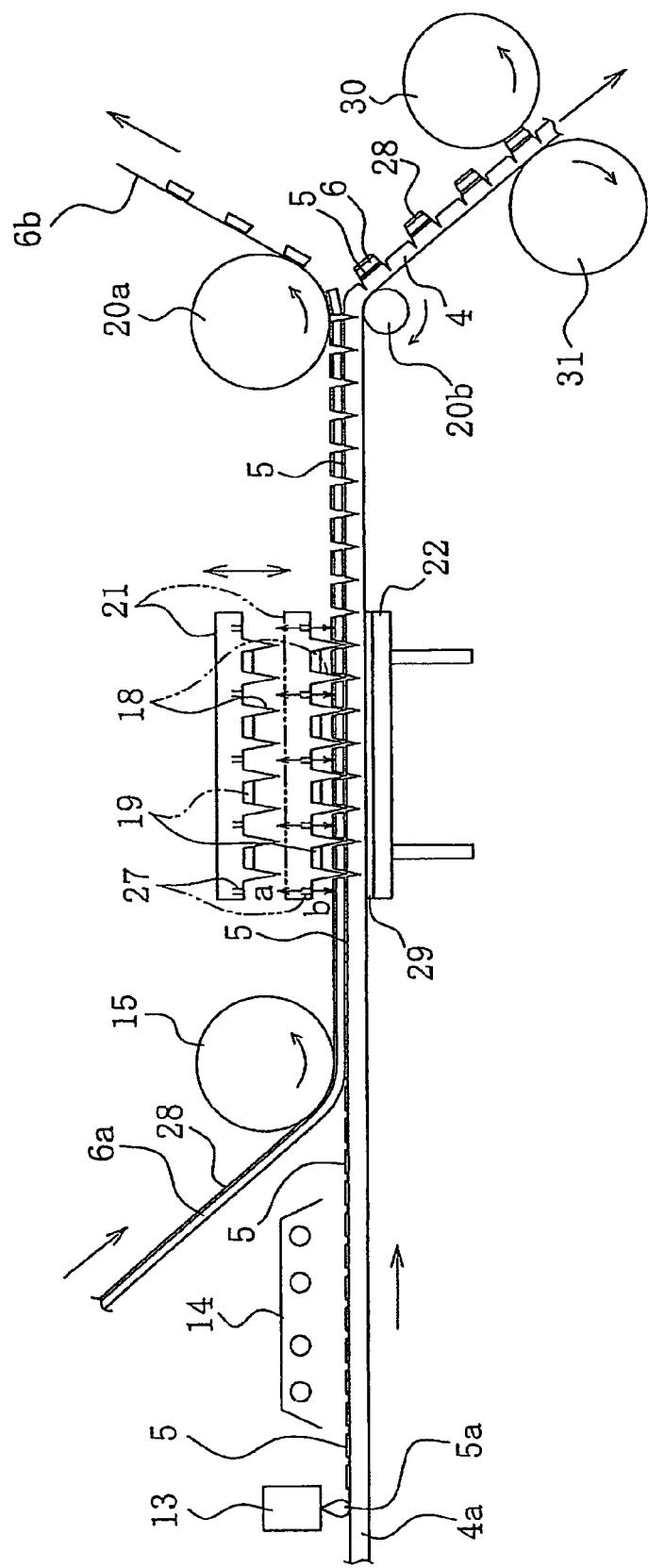
FIG. 14 is a schematic side view showing a device for manufacturing an antenna according to an embodiment 9 of the present invention.

The present embodiment 9 has a configuration in which a flat plate 21 as a flat blade knife of a flat press machine is substituted for the processing cylinder 16 in the embodiment 7, and a pedestal 22 is substituted for the receiving roller 17 in the embodiment 7, as shown in FIG. 14.

Moreover, when bonding and punching are performed for a laminated body of a continuous body 6a of a conductive layer 6 and a continuous body 4a of a base material 4, the laminated body is pressed through a cushioned material. Specifically, a cushioned pressing body 29 such as a rubber sheet is provided on the upper surface of the pedestal 22. Thereby, a uniform pressure is applied to the laminated body when the body is pressed between the flat plate 21 and the pedestal 22, and the conductive layer 6 is accurately punched on the base material 4, and, at the same time, is appropriately bonded to the base material 4.

Furthermore, portions similar to those in FIG. 12 and FIG. 8 are denoted by the same reference numbers in FIG. 14 as those in FIG. 12 and FIG. 8, and duplicated description will be eliminated.

Embodiment 10

Figure 15:
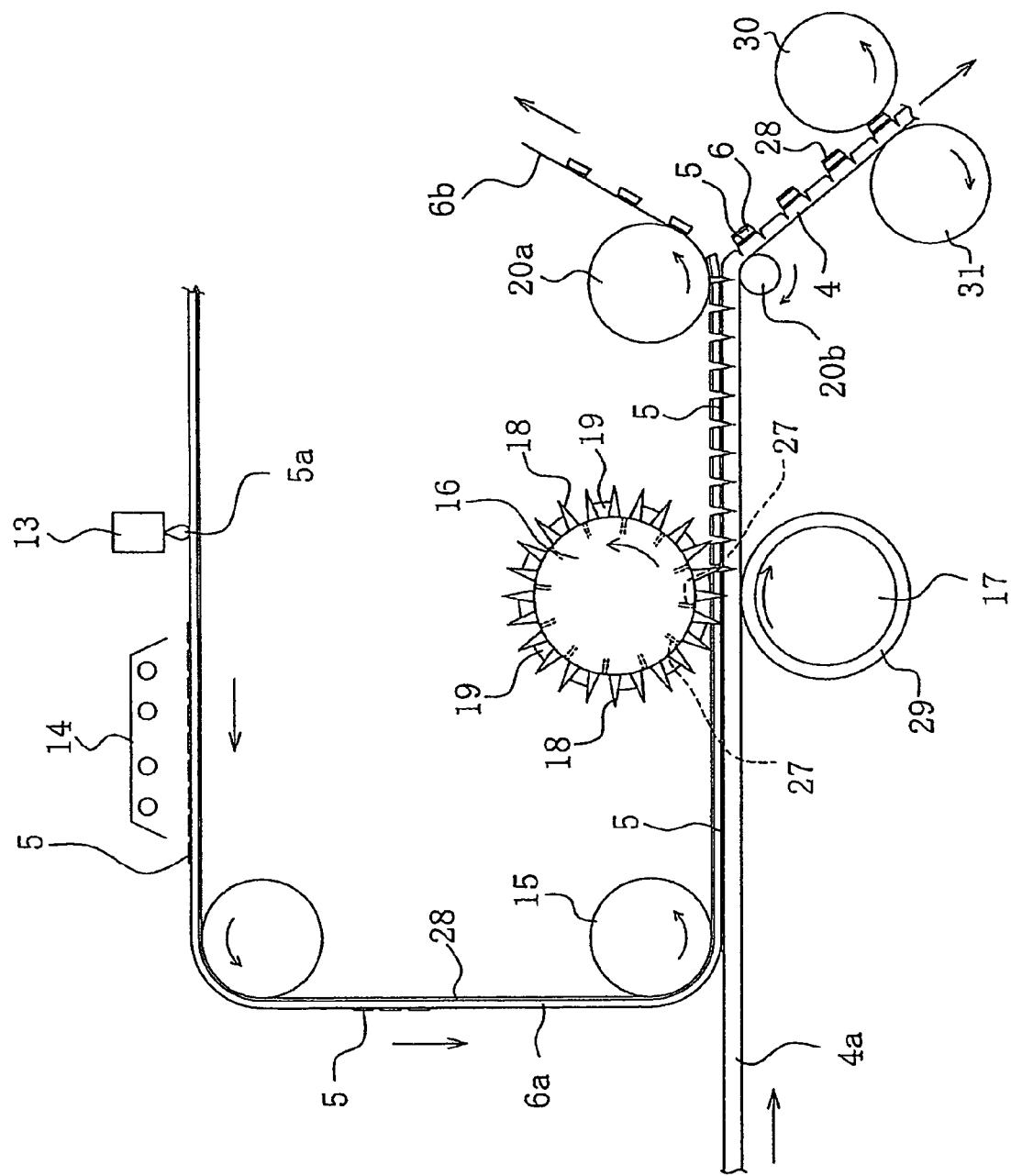
FIG. 15 is a schematic side view showing a device for manufacturing an antenna according to an embodiment 10 of the present invention.

As shown in FIG. 15, the present embodiment 10 has a configuration, different from that of the embodiment 7, in which, while a continuous body 6a of a conductive layer 6 is run, a thermoplastic bonding agent layer 5 is printed on the surface of the body 6a in a predetermined pattern with an ink jet nozzle 13, and thermoplastic bonding agent layer 5 is dried with a drying machine 14. At the same time, the continuous body 6a of the conductive layer 6 is configured to be laminated on the continuous body 4a through the side of the thermoplastic bonding agent layer 5 while a continuous body 4a of a base material 4 is run, for heating and bonding.

Furthermore, portions similar to those in FIG. 12 and FIG. 11 are denoted by the same reference numbers in FIG. 15 as those in FIG. 12 and FIG. 11, and duplicated description will be eliminated.

Embodiment 11

An antenna manufactured according to a method and by a device according to the present embodiment 11 has a layer configuration similar to that shown in FIG. 3(A), but a bonding agent layer 5 is formed of a bonding agent different in the character from that of the embodiment.

That is, an ultraviolet-ray (UV) or electron-beam (EB) curable bonding agent layer is printed on a sheet-like base material 4 made of paper, resin and the like in the same pattern as that of the antenna 2, and a conductive layer 6 comprising metal foil of aluminum, copper, copper alloy, phosphor bronze, SUS and the like, or alloy foil is bonded to the above UV or EB curable bonding agent layer in the pattern of the antenna 2. The UV or the EB curable bonding agent layer is applied on the pattern of the antenna 2 according to printing methods such as ink jet printing, gravure printing, flexo printing, screen printing and the like. As the UV or the EB curable bonding agent layer 5 is formed on the base material 4 according to the above printing method as described above, the conductive layer 6 is formed on the base material 4 without large bulges, and the bonding agent is prevented from squeezing out from the lower side of the conductive layer 6.

Here, the surface of the conductive layer 6 is covered with a protective layer 28 as required as shown in FIG. 3(B) to protect the surface from being oxidized, being scratched and the like. Resin and the like are used as the protective layer 28. Moreover, the UV or EB curable bonding agent layer may be also applied to a bonding agent layer 11 of an interposer 3 shown in FIG. 5.

Subsequently, a method, together with a device, for manufacturing the above-described antenna will be explained, based on FIG. 16.

(1) First, a continuous body 4a of a base material 4 and a continues body 6a of metal foil as a conductive layer 6 are prepared, and both the continuous bodies 4a and 6a are configured to run at the same speed as each other in the direction of the arrow in the drawing.

(2) An ink jet nozzle 13 is arranged above a running path of the continuous body 4a of the base material 4, and the above ink jet nozzle 13 discharges a liquid UV or EB curable bonding agent 32a toward the surface of the continuous body 4a of the base material 4. Thereby, a UV or EB curable bonding agent layer 32 is printed on the surface of the continuous body 4a of the base material 4 in the same pattern as that of an antenna 2 at constant intervals.

(3) Moreover, while the continuous body 6a of the metal foil as the conductive layer 6 is guided by a guide roller 15, the continuous body 6a is laminated on the continuous body 4a of the base material 4 through the side of the UV or EB curable bonding agent layer 32, and runs as a laminated body.

(4) With an UV or EB applying device 33 set up on the downstream side of the guide roller 15, UV or EB is applied to the UV or EB curable bonding agent layer 32 from the side of the base material 4. Thereby, a bonding property is given to the UV or EB curable bonding agent layer 32. As UV is required to pass through the base material 4 when the UV applying device is used, the base material 4 is formed of transparent or semi-transparent resin, glass and the like. As only EB is required to pass through the base material 4 when the EB applying device is used, the base material 4 may be formed of not only transparent or semi-transparent, but also opaque resin, glass, paper and the like.

(5) A processing cylinder 16 and a receiving roller 17 are arranged on the downstream side of the UV or EB applying device 33 so that the continuous body 4a of the base material 4 and the continuous body 6a of the metal foil as the conductive layer 6 run through between the cylinder 16 and the roller 17.

Punching blades 18 corresponding to the pattern of the antenna 2 are provided on the peripheral surface of a roller of the processing cylinder 16. The punching blade 18 punches the one pattern of the antenna 2, and, for example, four pairs of the blades 18 are arranged on the peripheral surface of the processing cylinder 16. However, the number of pairs of the blades 18 which are arranged is different, depending on the size of the antenna, the diameter of the processing cylinder and the like. A pressing body 34 is inserted between the blades for the pattern portion of the punching blade 18 as required. Preferably, the pressing body 34 is made of materials with a cushion performance such as rubber, and heat-resistant resin. Moreover, a portion corresponding to the pressing body 34 may be also formed of the same material as that of the punching blade 18.

The receiving roller 17 may be a metal roller itself, but, preferably, a cushioned pressing body 29 made of a cushioned material such as a rubber sheet is provided around the peripheral surface thereof.

The continuous body 4a of the base material 4 and the continuous body 6a of the metal foil as the conductive layer 6 are drawn into between the processing cylinder 16 and the receiving roller 17 while the bodies 4a and 6a are laminated on each other, and the metal foil is punched in the pattern of the antenna 2 with the punching blade 18. Moreover, the punched conductive layer 6 with the pattern of the antenna 2 is pressed by the pressing body 34 to the UV or EB curable bonding agent layer 32 which has the same pattern as that of the antenna 2, and is positioned on the continuous body 4a of the base material 4. As a bonding property is given by application of UV or EB to the UV or EB curable bonding agent layer 32 with a shape corresponding to the pattern of the antenna at that time, the conductive layer 6 is bonded to the surface of the continuous body 4a of the base material, using the above UV or EB curable bonding agent layer 32.

At bonding or punching, a uniform pressure is applied to the laminated body of the base material 4 and the conductive layer 6 because the cushioned pressing body 29 is disposed on the receiving roller 17.

Moreover, a slit 7 shown in FIG. 3 is formed along the outline of the antenna 2 by the point of the punching blade 18 when the conductive layer 6 of the metal foil is punched. Thereby, the conductive layer 6 is accurately punched according to the pattern of the antenna 2, and the outline of the pattern of the antenna 2 is neatly formed.

(6) Separating rollers 20a and 20b are provided on the downstream side of the processing cylinder 16, and the continuous body 4a of the base material 4 and the continuous body 6a of the metal foil as the conductive layer 6 are pulled in different directions from each other just after passing through the separating rollers 20a and 20b. Then, the antenna 2 runs in the direction of the arrow in the drawing, being held carried on the continuous body 4a of the base material 4, and the unnecessary portion 6b of the metal foil runs in the direction of the arrow in the drawing, being separated from the continuous body 4a of the base material 4.

The unnecessary portion 6b of the metal foil may be also collected by sucking with a sucking device, or by being taken up onto a take-up roller (not shown).

(7) Hot pressing means is provided on the downstream side of the separating rollers 20a and 20b as required, wherein, according to the means, the laminated body of the base material 4 and the metal foil after removing the unnecessary portion 6b of the conductive layer 6 is pressed, being kept heated. Specifically, the hot pressing means has a heating roller 30 and a pressing roller 31. The whole pattern of the conductive layer 6 is smoothly bonded to the surface of the base material 4, by hot pressing of the laminated body with the both rollers 30, and 31, even when air bubbles and the like exist between the conductive layer 6 of the metal foil and the base material 4, the edge of the pattern of the conductive layer 6 is curled from the base material 4, and the surface of the conductive layer 6 has a wavy surface after the pattern is punched.

By adjusting the pressing force, the heating temperature and the like given to the base material 4 with the heating roller 30 and the pressing roller 31 during the above hot pressing, the pattern of the conductive layer 6 may be bonded to the base material 4 so that the pattern is protruding from the material 4 similarly as shown in FIG. 24, or so that the pattern is buried in the softened material 4 similarly as shown in FIG. 25. In the latter case, the whole surface of the base material 4 become smooth to more adequately protect the pattern of the conductive layer 6 from, for example, being worn away.

Thereafter, the continuous body 4a of the base material 4 is divided into each antenna 2 which is provided for manufacturing, for example, the above-described wireless tag.

Here, the conductive sheet 9 with a rectangular shape in the interposer 3 may be also manufactured according to a method and by a device, which are similar to those used for manufacturing the antenna 2.

Embodiment 12

Figure 17:
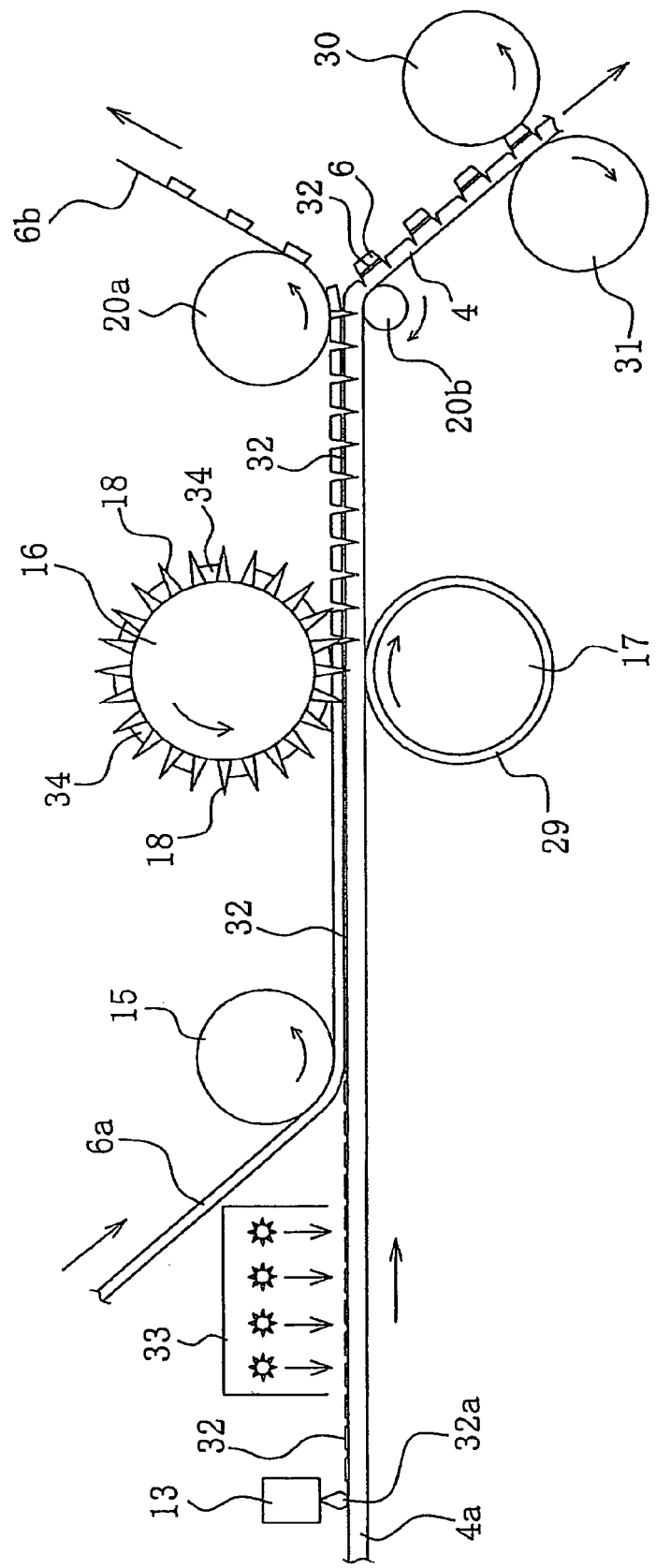
FIG. 17 is a schematic side view showing a device for manufacturing an antenna according to an embodiment 12 of the present invention.

As shown in FIG. 17, the present embodiment 12 has a configuration, different from that of the embodiment 11, in which a UV or EB applying device 33, which applies UV or EB directly to a UV or EB curable bonding agent layer 32 on a base material 4, is arranged on the upstream side of a guide roller 15. Thereby, a bonding property is given to the UV or EB curable bonding agent layer 32 before the conductive layer 6 is laminated on the base material 4 through the side of the UV or EB curable bonding agent layer 32. Accordingly, different from the case of the embodiment 11, bonding property may be given to the UV or EB curable bonding agent layer 32 even when UV or EB does not pass through the base material 4.

Figure 16:
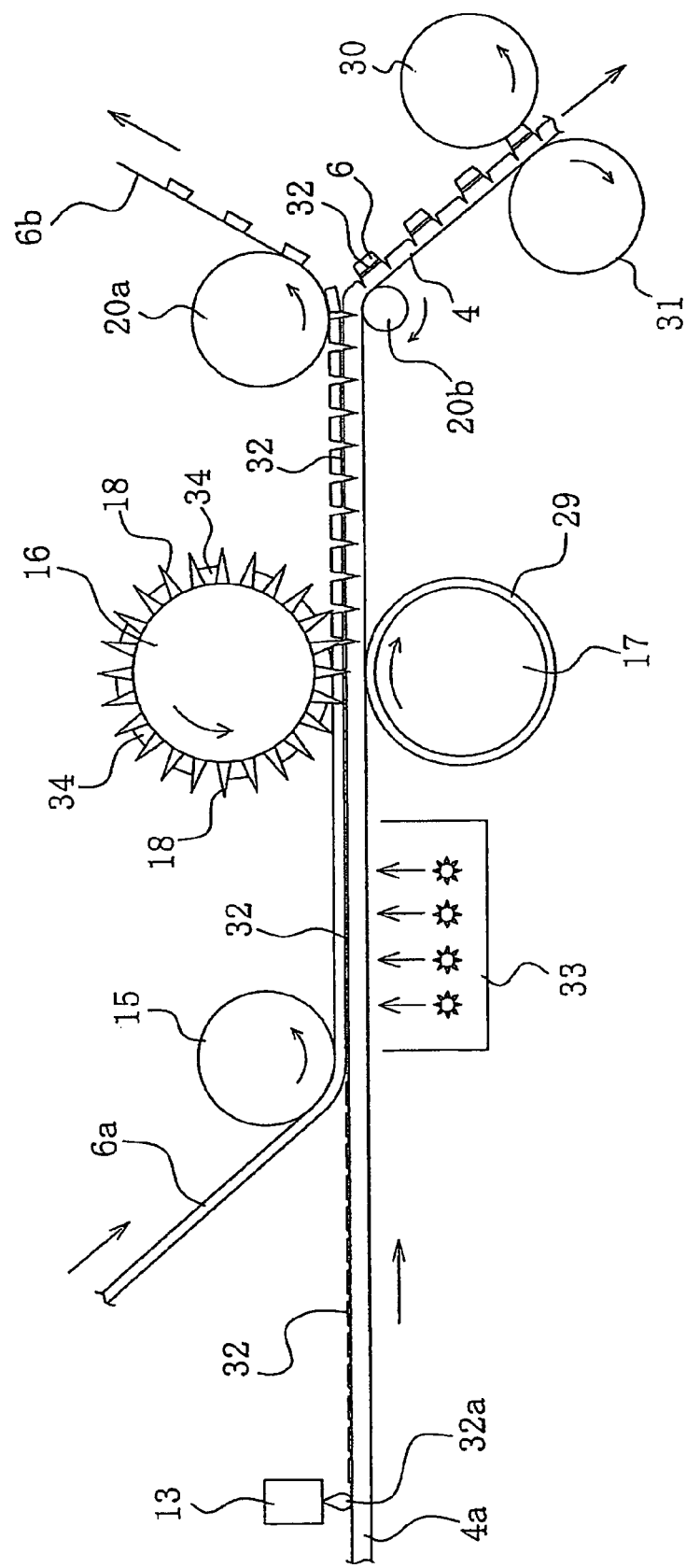
FIG. 16 is a schematic side view showing a device for manufacturing an antenna according to an embodiment 11 of the present invention.

Furthermore, portions similar to those in FIG. 16 are denoted by the same reference numbers in FIG. 17 as those in FIG. 16, and duplicated description will be eliminated.

Embodiment 13

Figure 18:
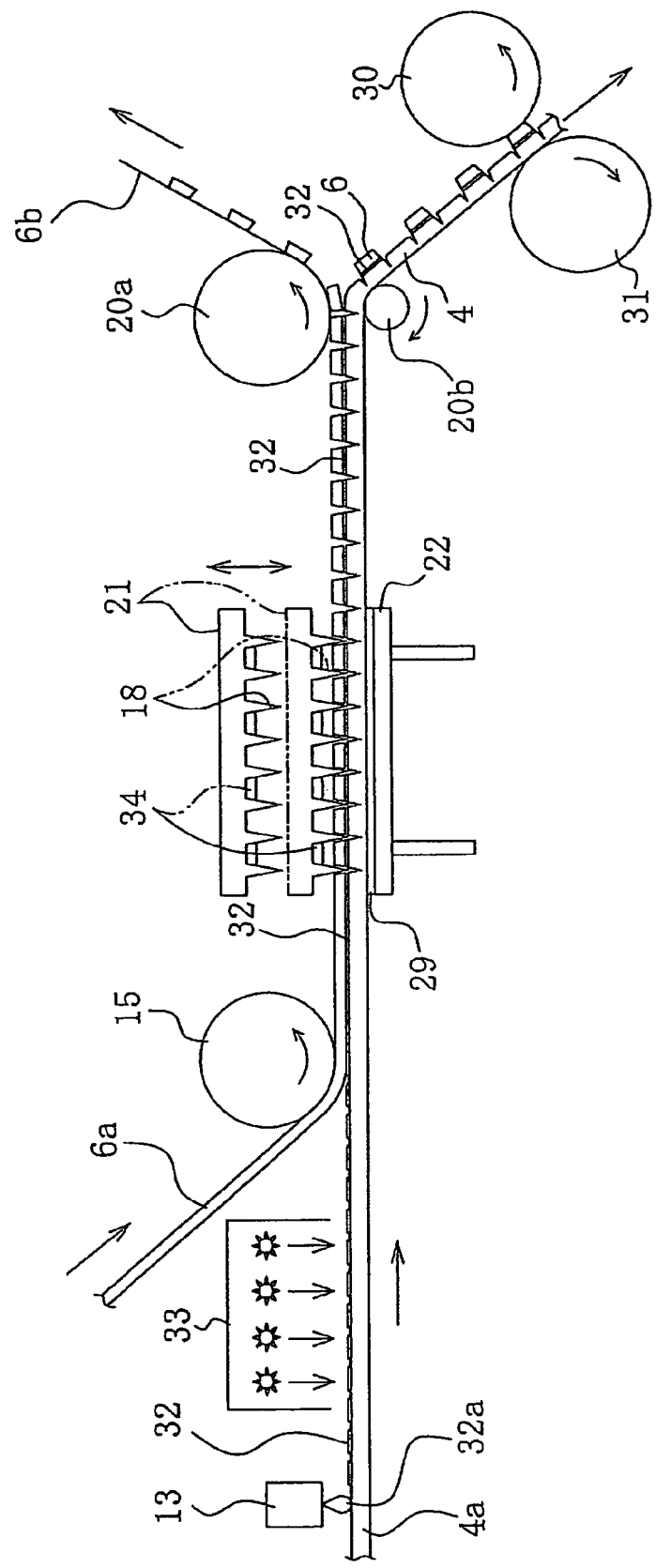
FIG. 18 is a schematic side view showing a device for manufacturing an antenna according to an embodiment 13 of the present invention.

As shown in FIG. 18, the present embodiment 13 has a configuration in which a flat plate 21 as a flat blade knife of a flat press machine is substituted for the processing cylinder 16 in the embodiment 12, and a pedestal 22 is substituted for the receiving roller 17 in the embodiment 12.

A pressing body 34 is inserted between the blades for the pattern portion of the punching blade 18 as required. Preferably, the pressing body 34 is made of materials with a cushion performance such as rubber, and heat-resistant resin. Moreover, a portion corresponding to the pressing body 34 may be also formed of the same material as that of the punching blade 18.

Furthermore, portions similar to those in FIG. 17 are denoted by the same reference numbers in FIG. 18 as those in FIG. 17, and duplicated description will be eliminated.

Embodiment 14

Figure 19:
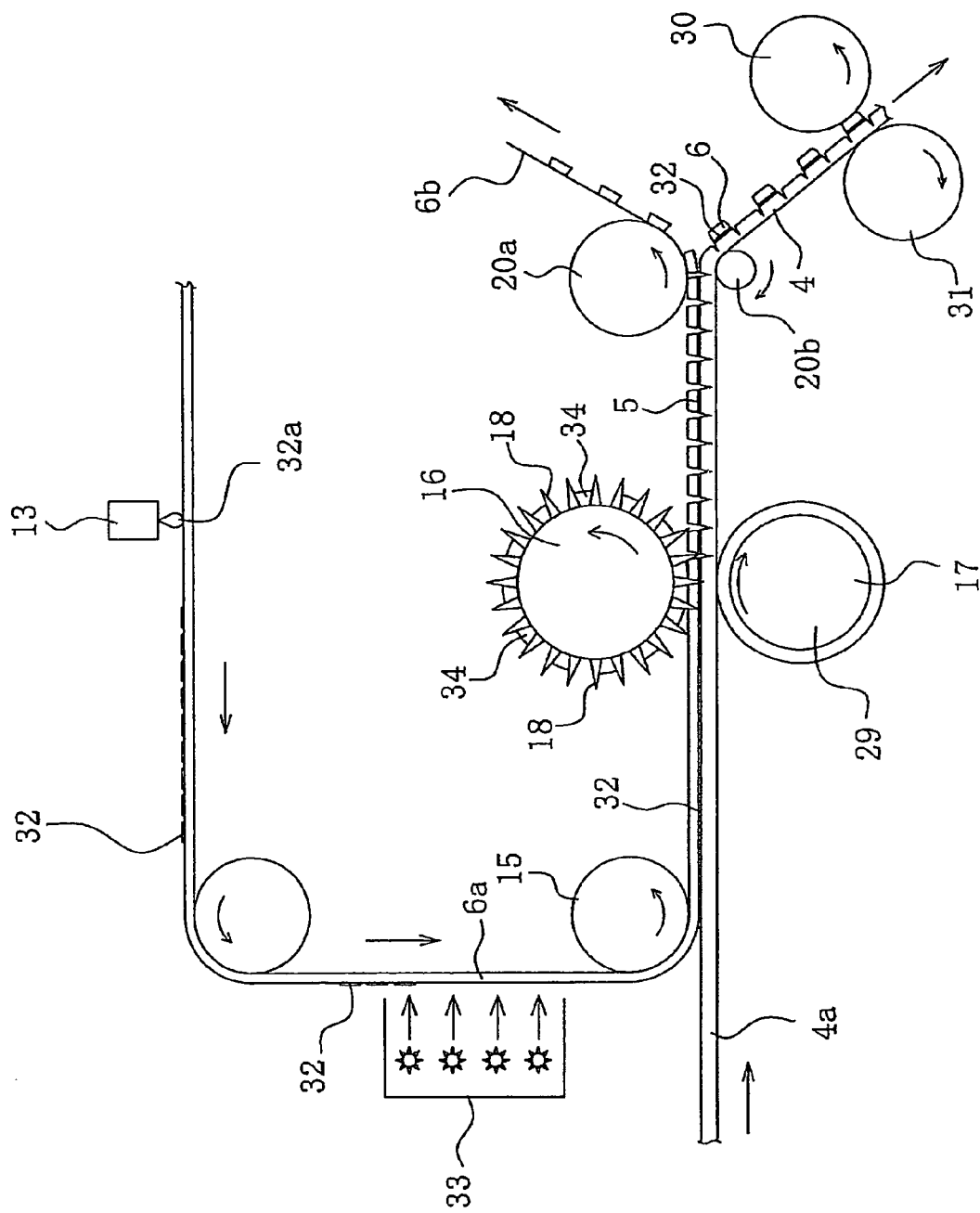
FIG. 19 is a schematic side view showing a device for manufacturing an antenna according to an embodiment 14 of the present invention.

As shown in FIG. 19, the present embodiment 14 has a configuration, different from that of the embodiment 10, in which, while a continuous body 6a of a conductive layer 6 is run, a UV or EB curable bonding agent layer 32 is printed on the surface of the body 6a in a predetermined pattern with an ink jet nozzle 13, UV or EB is applied to a UV or EB curable bonding agent layer 32, using a UV or EB applying device 33, and the continuous body 6a of the conductive layer 6 is laminated on the base material 4 through the side of the UV or EB curable bonding agent layer 32, using a guide roller 15 as laminating means.

As UV or EB is applied directly to the UV or EB curable bonding agent layer 32, a bonding property may be given to the UV or EB curable bonding agent layer 32, regardless of the material used for the continuous body in which the UV or EB curable bonding agent layer 32 is provided.

Furthermore, portions similar to those in FIG. 15 are denoted by the same reference numbers in FIG. 19 as those in FIG. 15, and duplicated description will be eliminated.

Embodiment 15

Figure 20:
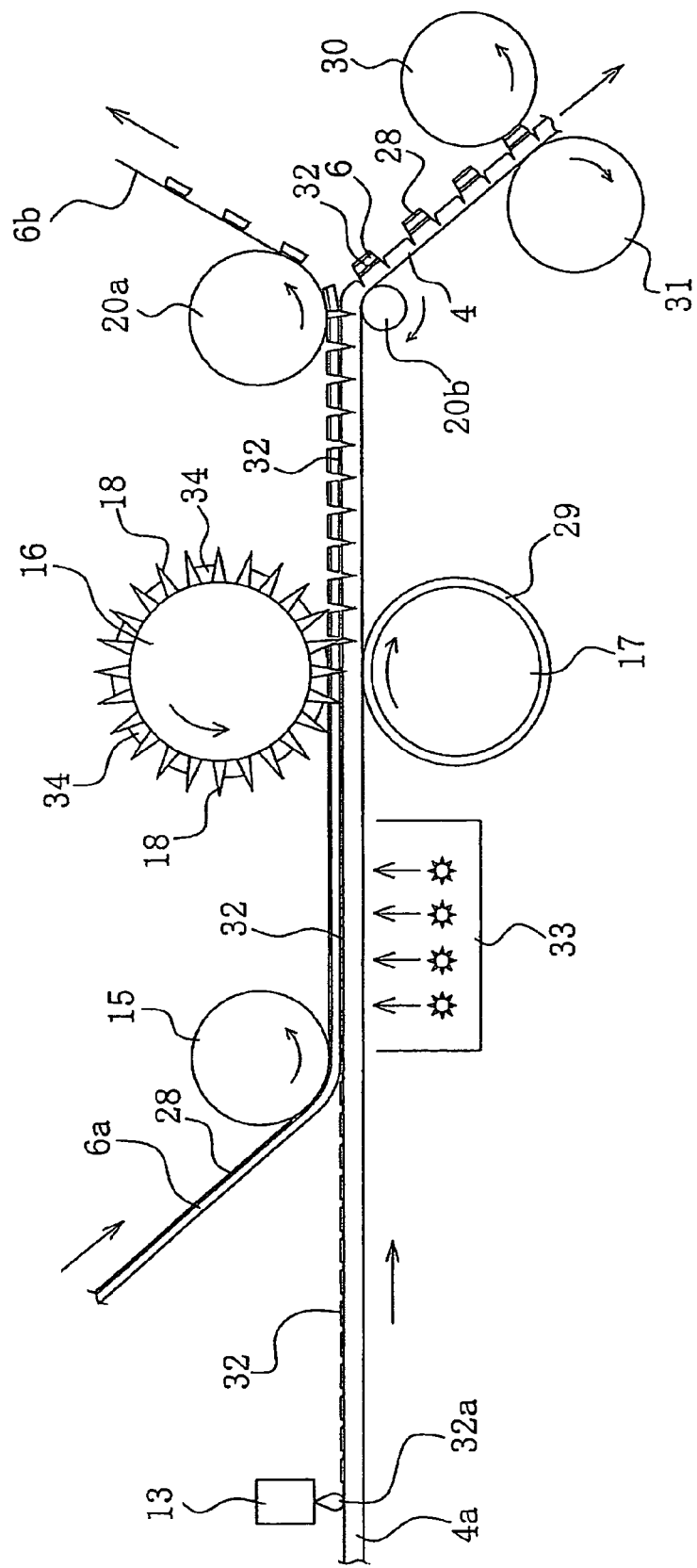
FIG. 20 is a schematic side view showing a device for manufacturing an antenna according to an embodiment 15 of the present invention.

As shown in FIG. 20, the present embodiment 15 has a configuration, different from that of the embodiment 11, in which there is used a continuous body 6a of a conductive layer 6 comprising metal foil the surface of which is covered with a protective layer 28. The protective layer 28 is formed of, for example, resin. By providing the protective layer 28, the conductive layer 6 is protected from being oxidized, being scratched and the like during manufacturing the conductive member for a non-contact type data carrier. The antenna 2 as the conductive member for a non-contact type data carrier has a layered structure shown in FIG. 24 or 25 when the antenna 2 is manufactured according to the above-described manufacturing method and by the above-described manufacturing device.

Furthermore, portions similar to those in FIG. 16 are denoted by the same reference numbers in FIG. 20 as those in FIG. 16, and duplicated description will be eliminated.

Embodiment 16

Figure 21:
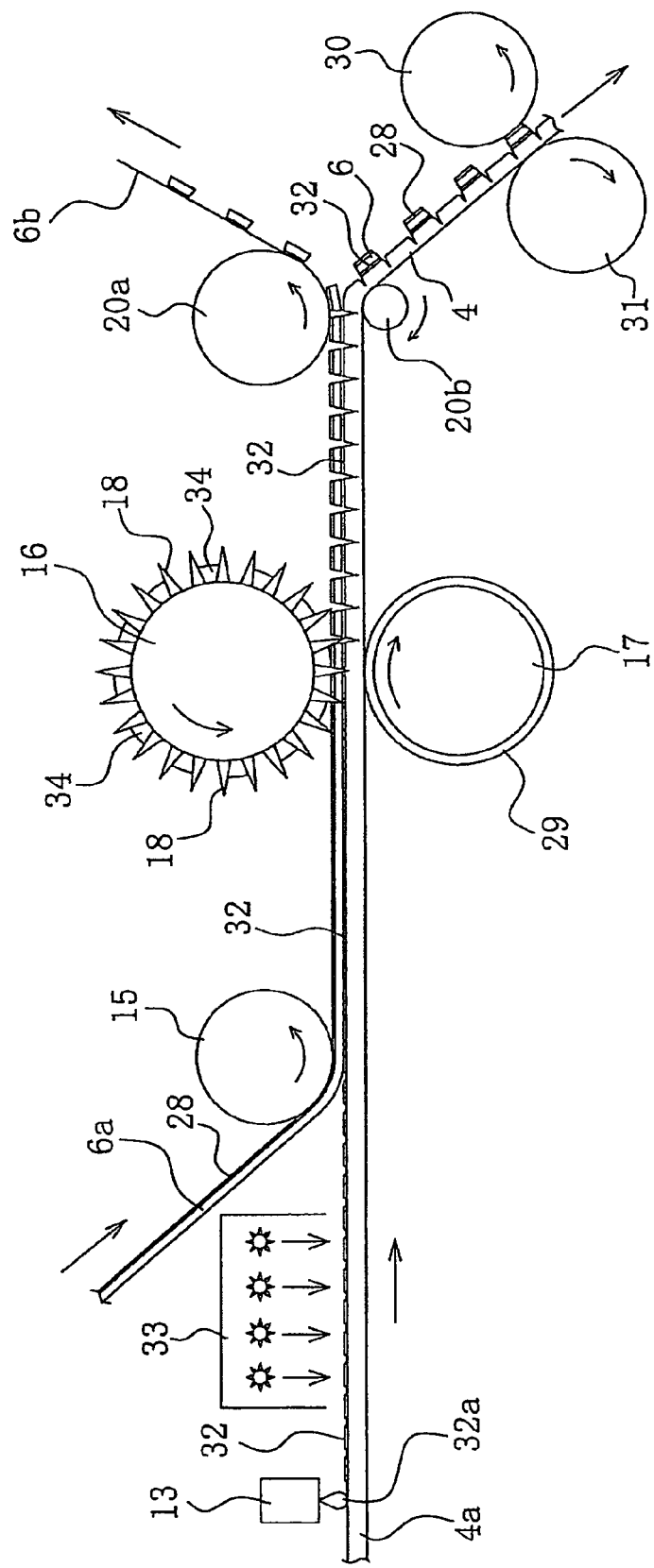
FIG. 21 is a schematic side view showing a device for manufacturing an antenna according to an embodiment 16 of the present invention.

As shown in FIG. 21, the present embodiment 16 has a configuration, different from that of the embodiment 12, in which there is used a continuous body 6a of a conductive layer 6 the surface of which is covered with a protective layer 28. The protective layer 28 is formed of, for example, resin. By providing the protective layer 28, the conductive layer is protected from being oxidized, being scratched and the like during manufacturing an antenna as the conductive member for a non-contact type data carrier.

Furthermore, portions similar to those in FIG. 17 are denoted by the same reference numbers in FIG. 21 as those in FIG. 17, and duplicated description will be eliminated.

Embodiment 17

Figure 22:
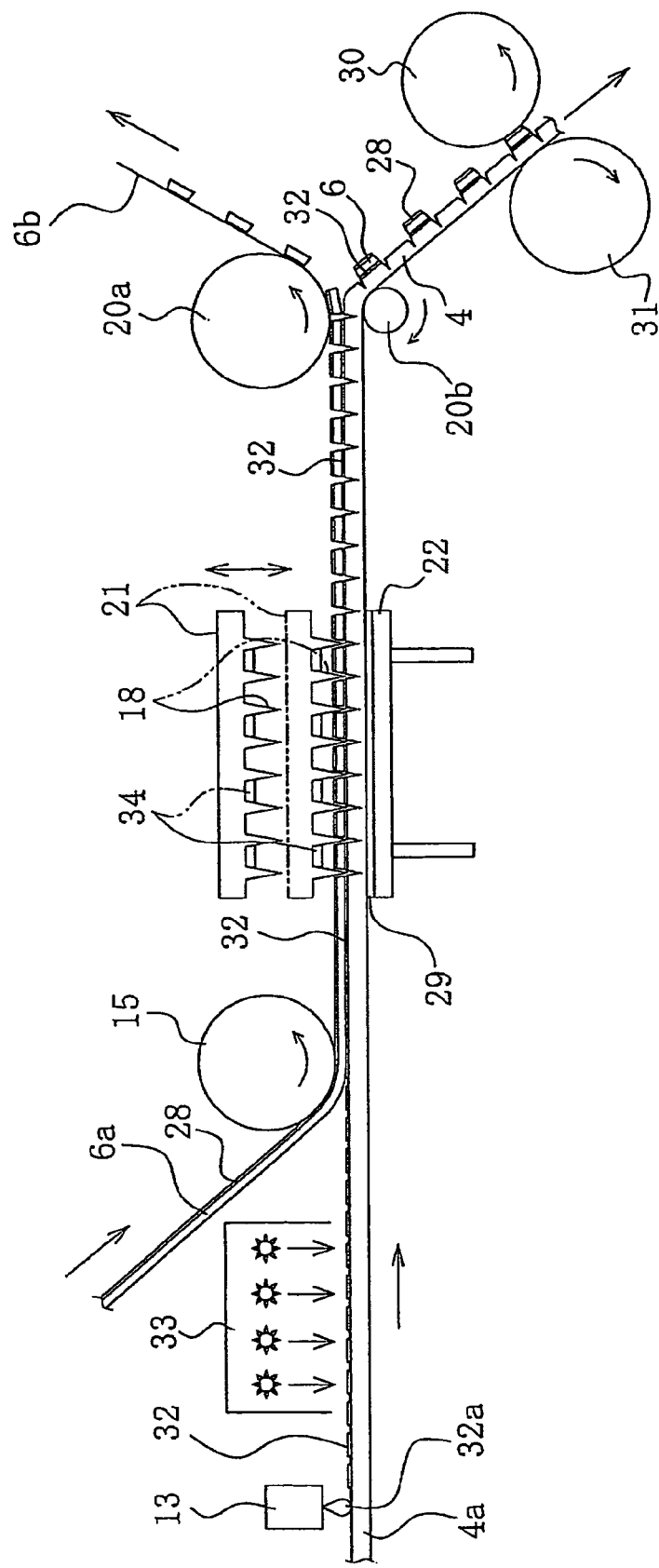
FIG. 22 is a schematic side view showing a device for manufacturing an antenna according to an embodiment 17 of the present invention.

As shown in FIG. 22, the present embodiment 17 has a configuration, different from that of the embodiment 13, in which there is used a continuous body 6a of a conductive layer 6 the surface of which is covered with a protective layer 28. The protective layer 28 is formed of, for example, resin. By providing the protective layer 28, the conductive layer is protected from being oxidized, being scratched and the like during manufacturing an antenna as the conductive member for a non-contact type data carrier.

Furthermore, portions similar to those in FIG. 18 are denoted by the same reference numbers in FIG. 22 as those in FIG. 18, and duplicated description will be eliminated.

Embodiment 18

Figure 23:
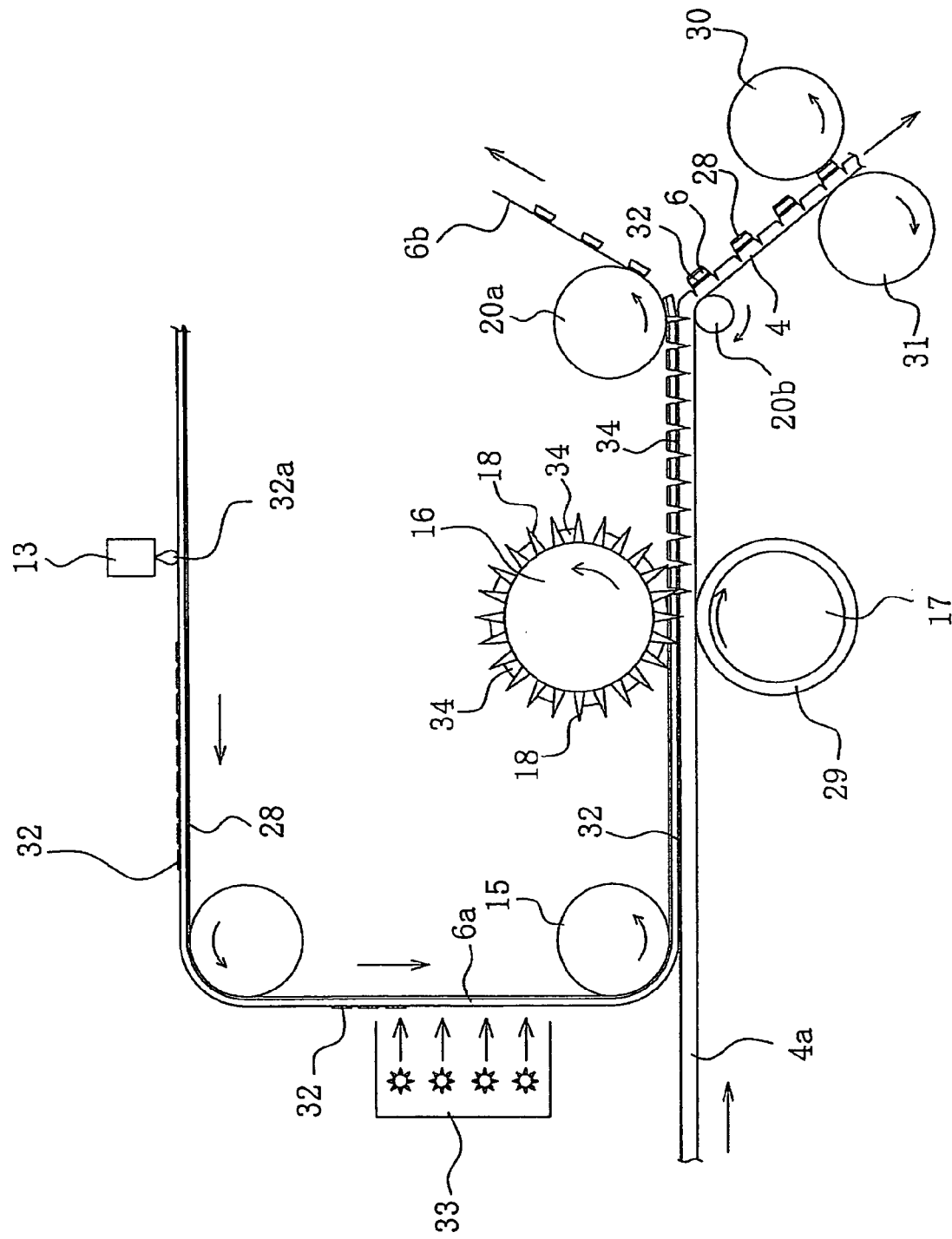
FIG. 23 is a schematic side view showing a device for manufacturing an antenna according to an embodiment 18 of the present invention.

As shown in FIG. 23, the present embodiment 18 has a configuration, different from that of the embodiment 14, in which there is used a continuous body 6a of a conductive layer 6 the surface of which is covered with a protective layer 28. The protective layer 28 is formed of, for example, resin. By providing the protective layer 28, the conductive layer is protected from being oxidized, being scratched and the like during manufacturing an antenna as the conductive member for a non-contact type data carrier.

Furthermore, portions similar to those in FIG. 19 are denoted by the same reference numbers in FIG. 23 as those in FIG. 19, and duplicated description will be eliminated.

Embodiment 19

Figure 26:
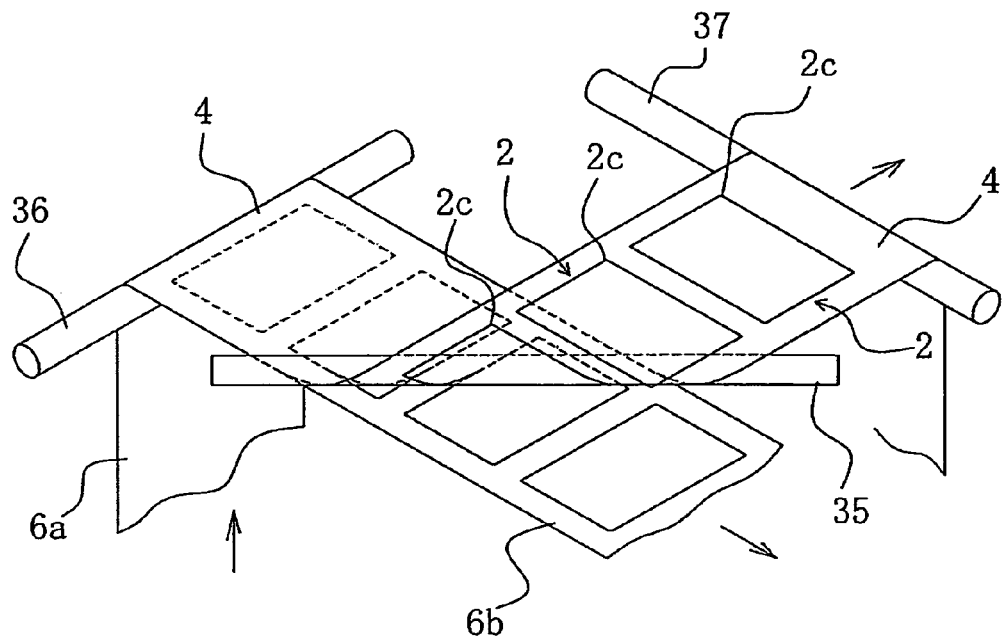
FIG. 26 is a perspective view showing a separating process for a device for manufacturing an antenna according to an embodiment 19 of the present invention.

As shown in FIG. 26, a turn bar 35 is used during a peeling process in the present embodiment 19.

When a laminated body of a base material 4 and a conductive layer 6 is guided by a first guide roller 36 to a turn bar 35, by which the layered body is separated to the base material 4 and an unnecessary portion 6b of the conductive layer, and, at the same time, reverses the base material 4. Then, the material 4 runs to a second guide roller 37. As the base material 4 passes through the turn bar 35 so that the corner portion 2c of the pattern of an antenna 2 comprising the conductive layer 6 reaches the bar 35 first, the pattern of the antenna 2 is easily separated from a continuous body 6a of the conductive layer 6 on the turn bar 35.

Embodiment 20

Figure 27:
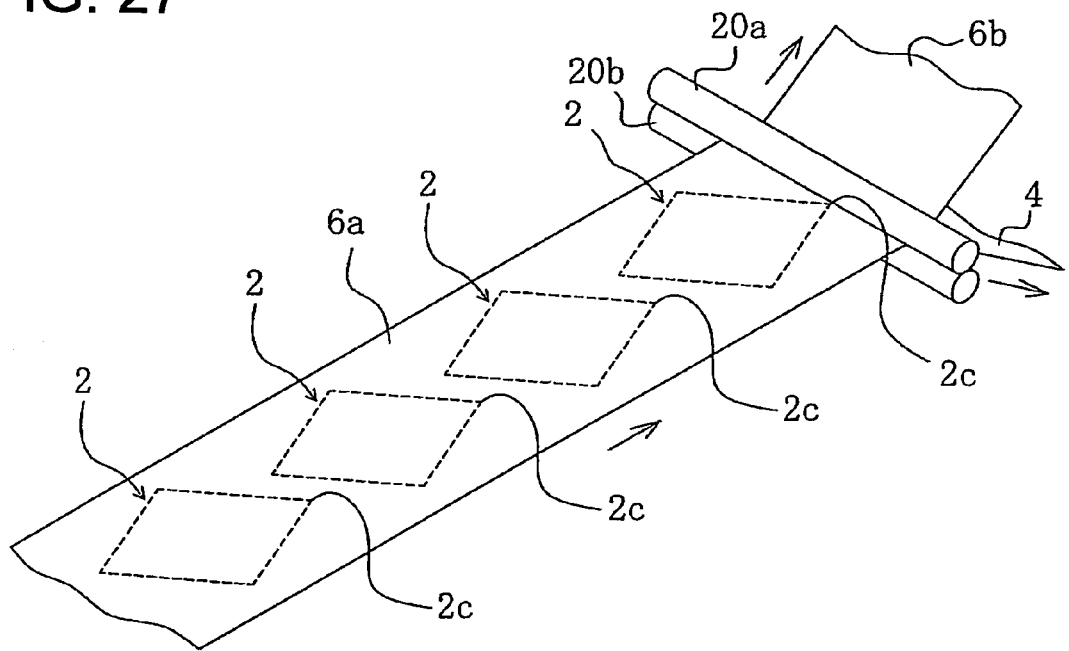
FIG. 27 is a perspective view showing a separating process for a device for manufacturing an antenna according to an embodiment 20 of the present invention.

The present embodiment 20 has a configuration, as shown in FIG. 27, in which the pattern of an antenna 2 is punched on a laminated body of a base material 4 and a conductive layer 6 so that the pattern is inclined to the running direction. Thereby, the pattern of the antenna 2 is easily separated from the conductive layer 6 because the corner portion 2c of the pattern of the antenna 2 reaches separating rollers 20a and 20b first when the laminated body is separated to a base material 4 and an unnecessary portion 6b while the body is passing through the rollers 20a and 20b.

Embodiment 21

Figure 28:
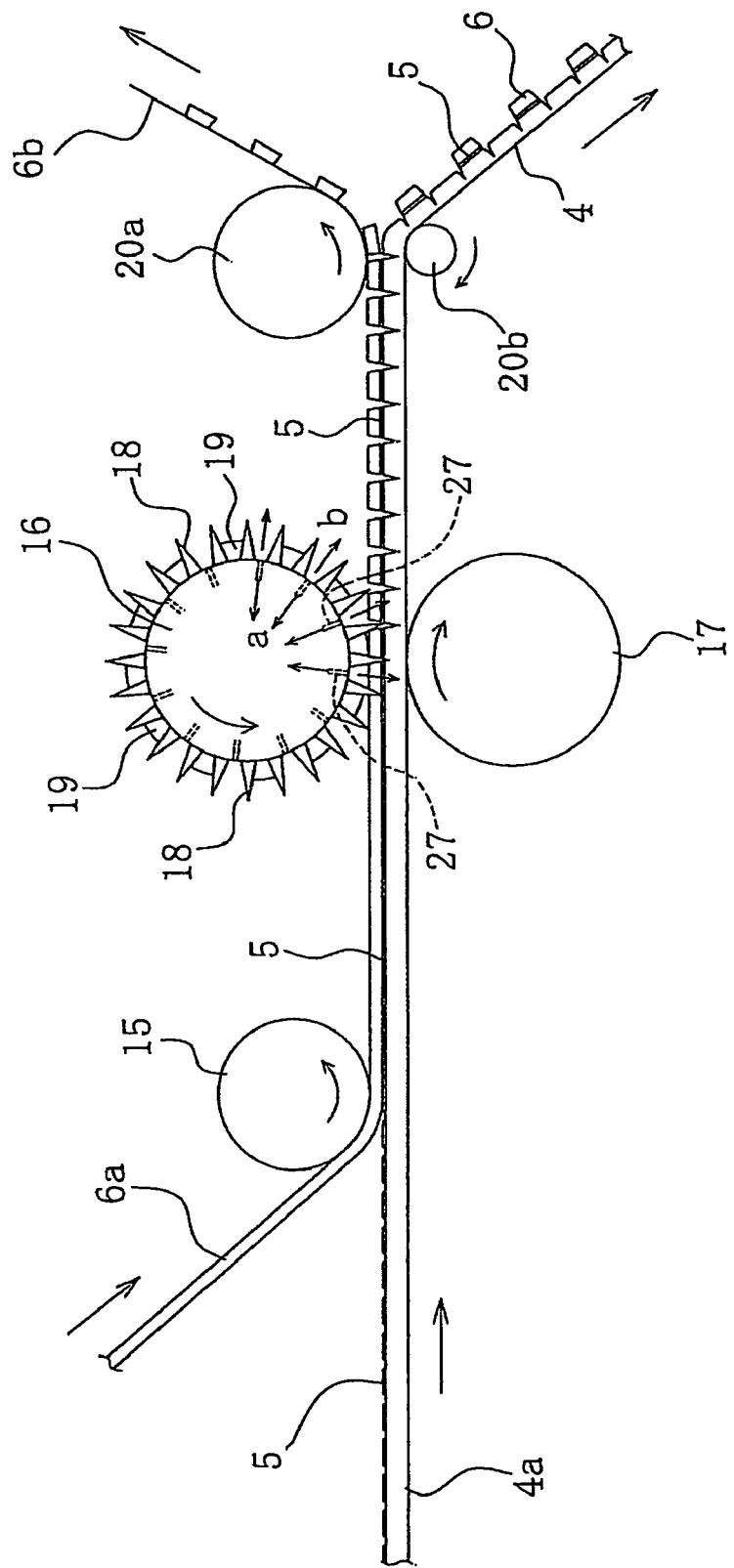
FIG. 28 is a schematic side view of a device for manufacturing an antenna according to an embodiment 21 of the present invention.

As shown in FIG. 28, the present embodiment 21 has a configuration, different from that of the embodiment 1 shown in FIG. 6, in which there is used a continuous body 4a of a base material 4 on the surface of which a thermoplastic bonding agent layer 5 is printed beforehand in the same pattern as that of an antenna 2 at constant intervals. The above continuous body 4a is supplied in one direction as shown in FIG. 28 by a sheet fed method or from a take-up roll. In the embodiment 21, an ink jet nozzle 13, a coating device and the like as a printing machine for patterning according to the embodiment 1 are separated from equipment for manufacturing a conductive member for a non-contact type data carrier.

A guide roller 15 is arranged on the downstream side in the supplying direction of the continuous body 4a of the base material 4, and a continuous body 6a is laminated on the continuous body 4a of the base material 4 through the thermoplastic bonding agent layer 5 while the continuous body 6a of metal foil as a conductive layer 6 is guided by the guide roller 15.

A processing cylinder 16 and a receiving roller 17 are arranged on the downstream side of the guide roller 15 so that the continuous body 4a of the base material 4 and the continuous body 6a of the metal foil as the conductive layer 6 run through between the cylinder 16 and the roller 17. In the same manner as that of the embodiment 1, the continuous body 4a of the base material 4 and the continuous body 6a of the metal foil as the conductive layer 6 are drawn into between the processing cylinder 16 and the receiving roller 17 while the bodies 4a and 6a are laminated on each other, and the metal foil is punched in the pattern of the antenna 2 with the punching blade 18.

The punched conductive layer 6 with the pattern of the antenna 2 is pressed by a heat transfer body 19 to thermoplastic bonding agent layer 5 which has the same pattern as that of the antenna 2, and is positioned on the continuous body 4a of the base material 4. On this occasion, thermoplastic bonding agent layer 5 melts by heat transferred from the heat transfer body 19, and the conductive layer 6 is bonded to the continuous body 4a of the base material, using the above melted thermoplastic bonding agent layer 5.

Separating rollers 20a and 20b are provided on the downstream side of the processing cylinder 16, and the continuous body 4a of the base material 4 and the continuous body 6a of the metal foil as the conductive layer 6 are pulled in different directions from each other just after passing through the separating rollers 20a and 20b. Then, the antenna 2 runs in the direction of the arrow in the drawing, being held carried on the continuous body 4a of the base material 4, and the unnecessary portion 6b of the metal foil runs in the direction of the arrow in the drawing, being separated from the continuous body 4a of the base material 4.

Furthermore, portions similar to those in FIG. 6 are denoted by the same reference numbers in FIG. 28 as those in FIG. 6, and duplicated description will be eliminated.

Embodiment 22

Figure 29:
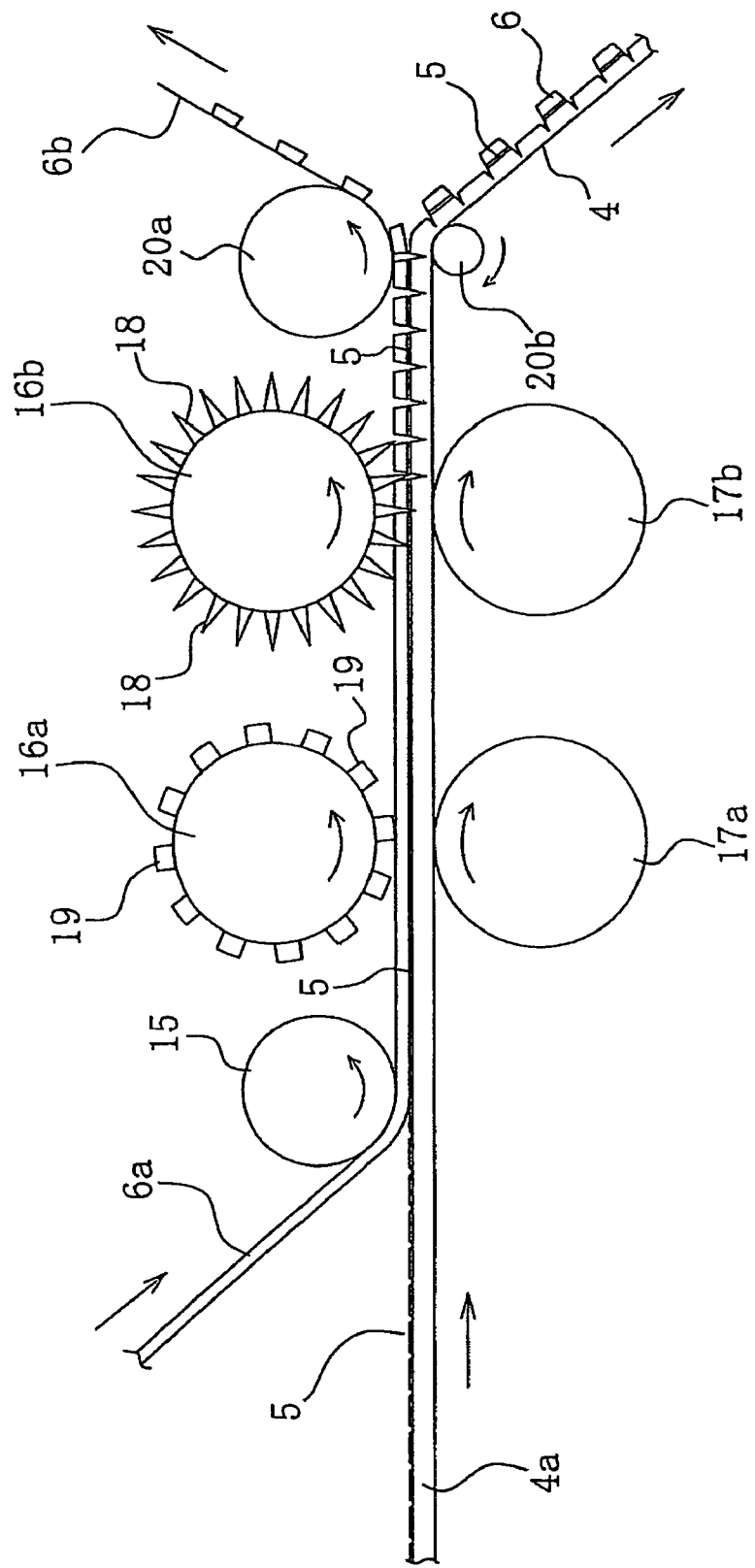
FIG. 29 is a schematic side view of a device for manufacturing an antenna according to an embodiment 22 of the present invention.

As shown in FIG. 29, the present embodiment 22 has a configuration, different from that of the embodiment 2 shown in FIG. 7, in which there is used a continuous body 4a of a base material 4 on the surface of which a thermoplastic bonding agent layer 5 is printed beforehand in the same pattern as that of an antenna 2 at constant intervals. The above continuous body 4a is supplied in one direction as shown in FIG. 28 by a sheet fed method or by unwinding from a take-up roll.

A guide roller 15 is arranged on the downstream side in the supplying direction of the continuous body 4a of the base material 4, and a continuous body 6a of metal foil as a conductive layer 6 is laminated on the continuous body 4a of the base material 4 through the thermoplastic bonding agent layer 5 while the continuous body 6a is guided by the guide roller 15.

Cylinders 16a and 16b and the like are arranged on the downstream side of the guide roller 15 in a similar manner to that of the embodiment 2. The continuous body 4a of the base material 4 and the continuous body 6a of the metal foil as the conductive layer 6 are drawn into between the processing cylinder 16a and the receiving roller 17a while the bodies 4a and 6a are laminated on each other, a thermoplastic bonding agent layer 5, which is printed by the pattern of the heat transfer body 19 on the heating cylinder 16a in the same pattern as that of the antenna 2 on the continuous body 4a of the base material 4, is melted, and the conductive layer 6 of the metal foil is pressed on the above melted thermoplastic bonding agent layer 5. Subsequently, the continuous body 4a of the base material 4 and the continuous body 6a of the metal foil as the conductive layer 6 are drawn into between the processing cylinder 16b and the receiving roller 17b while the bodies 4a and 6a are laminated on each other, and the metal foil is punched in the pattern of the antenna 2 with the punching blade 18. Thereafter, the continuous body 4a of the base material 4 and the continuous body 6a of the metal foil as the conductive layer 6 are separated from each other in the same manner as that of the embodiment 2.

Furthermore, portions similar to those in FIG. 7 are denoted by the same reference numbers in FIG. 29 as those in FIG. 7, and duplicated description will be eliminated.

Embodiment 23

Figure 30:
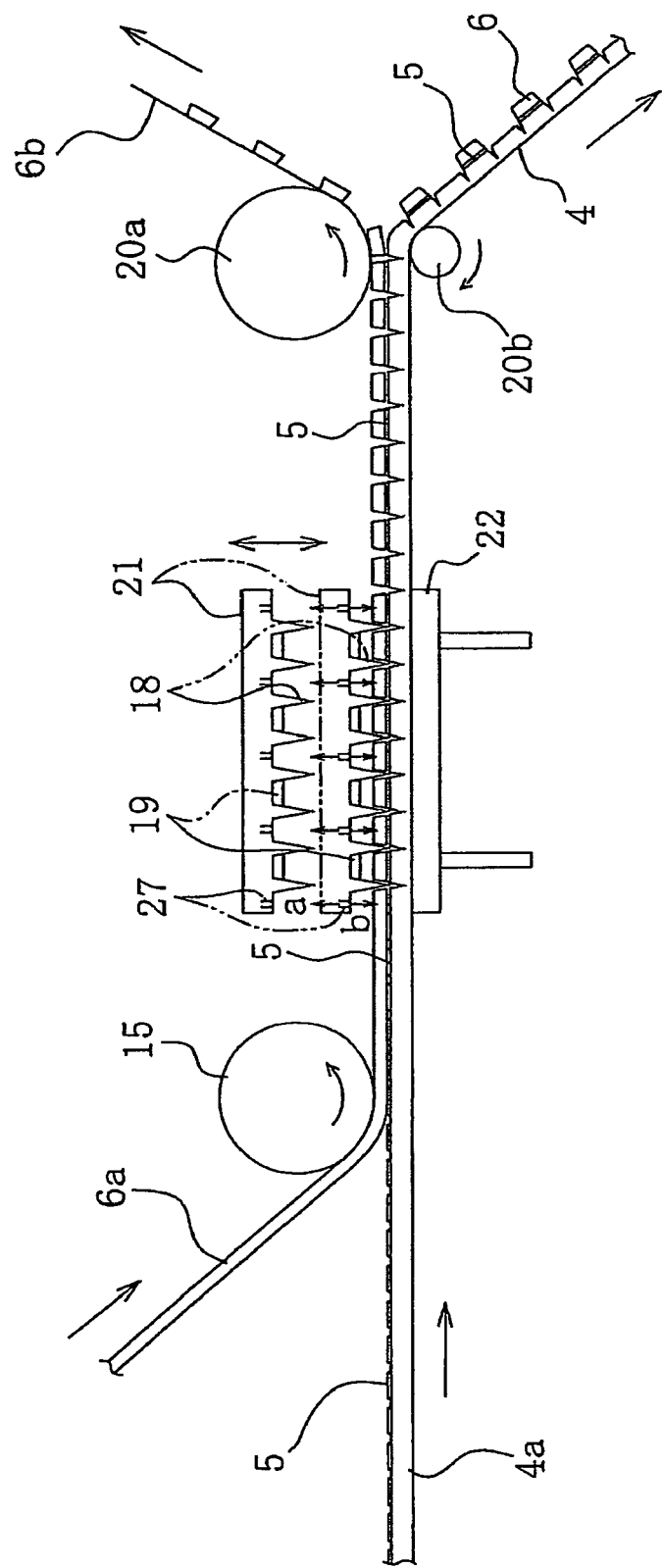
FIG. 30 is a schematic side view of a device for manufacturing an antenna according to an embodiment 23 of the present invention.

As shown in FIG. 30, the present embodiment 23 has a configuration, different from that of the embodiment 3 shown in FIG. 8, in which there is used a continuous body 4a of a base material 4 on the surface of which a thermoplastic bonding agent layer 5 is printed beforehand in the same pattern as that of an antenna 2 at constant intervals. The above continuous body 4a is supplied in one direction as shown in FIG. 28 by a sheet fed method or from a take-up roll.

A guide roller 15 is arranged on the downstream side in the supplying direction of the continuous body 4a of the base material 4, and a continuous body 6a of metal foil as a conductive layer 6 is laminated on the continuous body 4a of the base material 4 with the thermoplastic bonding agent layer 5 being interposed there between while the continuous body 6a is guided by the guide roller 15.

The continuous body 4a of the base material 4 and the continuous body 6a of the metal foil as the conductive layer 6 are intermittently fed at a constant pitch to between a processing flat plate 21 and a pedestal 22, and the processing flat plate 21 is reciprocally moved up and down to the pedestal 22. Then, the continuous body 6a of the metal foil as the conductive layer 6 is punched in the pattern of the antenna 2 at each reciprocal movement, and is pressed onto a melted thermoplastic bonding agent layer 5 on the continuous body 4a of the base material 4. Thereafter, the continuous body 4a of the base material 4 and the continuous body 6a of the metal foil as the conductive layer 6 are separated from each other in the same manner as that of the embodiment 3.

Furthermore, portions similar to those in FIG. 8 are denoted by the same reference numbers in FIG. 30 as those in FIG. 8, and duplicated description will be eliminated.

Embodiment 24

Figure 31:
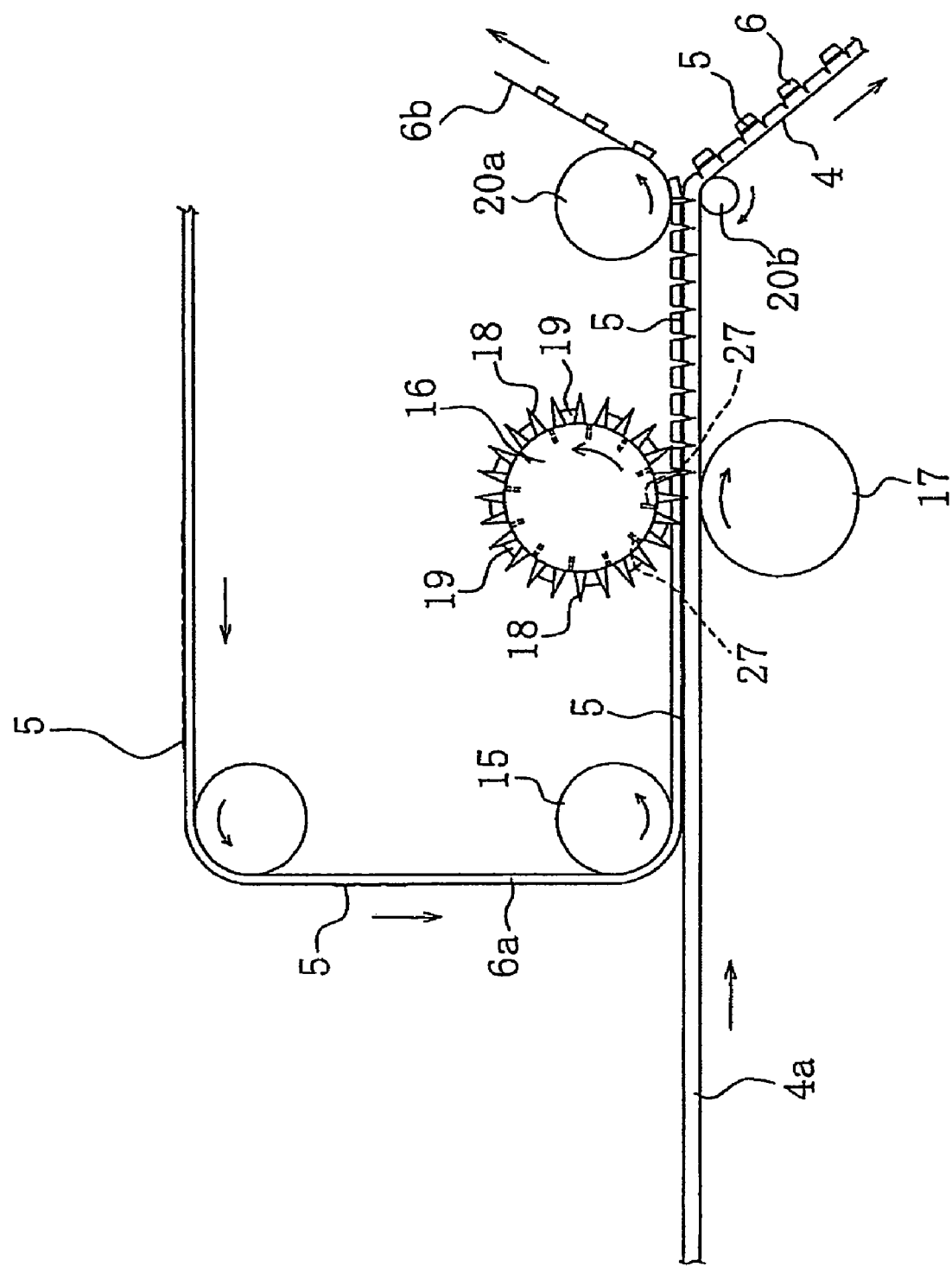
FIG. 31 is a schematic side view of a device for manufacturing an antenna according to an embodiment 24 of the present invention.

As shown in FIG. 31, the present embodiment 24 has a configuration, different from that of the embodiment 6 shown in FIG. 11, in which there is used a continuous body 6a of conductive layer 6 on the surface of which a thermoplastic bonding agent layer 5 is printed beforehand in the same pattern as that of an antenna 2 at constant intervals. The above continuous body 6a is supplied in one direction as shown in FIG. 31 by a sheet fed method or by unwinding from a take-up roll.

The continuous body 6a of the conductive layer 6 is laminated on a continuous body 4a of a base material 4 through the side of the thermoplastic bonding agent layer 5 for heating and bonding while the continuous body 6a of the conductive layer 6 is kept run, and, at the same time, the continuous body 4a of the base material 4 is kept run.

Furthermore, portions similar to those in FIG. 11 are denoted by the same reference numbers in FIG. 31 as those in FIG. 11, and duplicated description will be eliminated.

Embodiment 25

Figure 32:
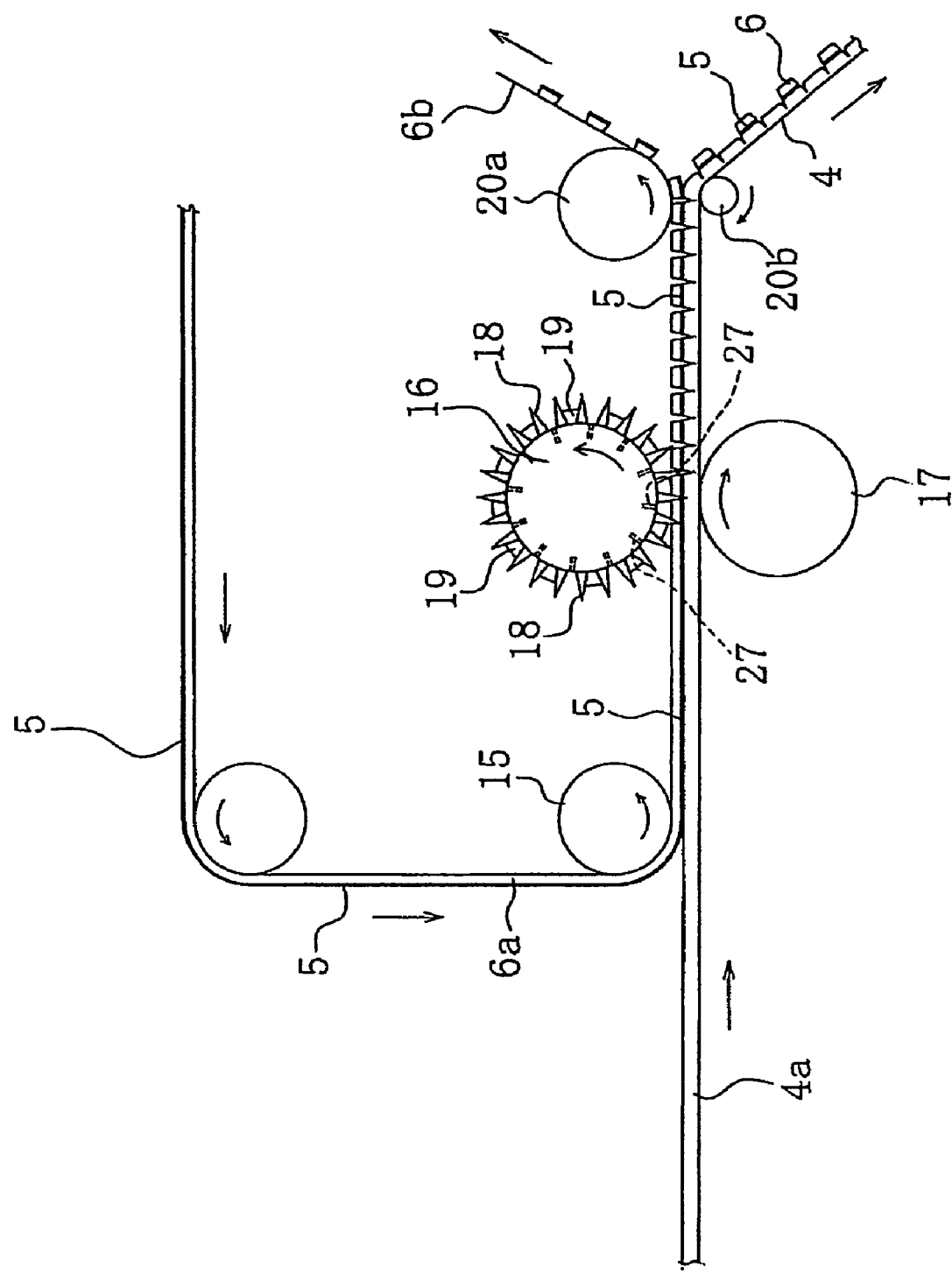
FIG. 32 is a schematic side view of a device for manufacturing an antenna according to an embodiment 25 of the present invention.

As shown in FIG. 32, the present embodiment 25 has a configuration, different from that of the embodiment 24 shown in FIG. 31, in which there is used a continuous body 6a of metal foil as a conductive layer 6 on the whole surface of which a thermoplastic bonding agent layer 5 is formed beforehand by solid printing or coating. The above continuous body 6a is supplied in one direction as shown in FIG. 31 by a sheet fed method or from a take-up roll.

The continuous body 6a of the conductive layer 6 is laminated on a continuous body 4a of a base material 4 through the side of the thermoplastic bonding agent layer 5, and only a portion corresponding to the pattern of an antenna is heated and bonded while the continuous body 6a of the conductive layer 6 is kept run, and, at the same time, the continuous body 4a of the base material 4 is kept run.

A separating roller 20a which removes an unnecessary portion 6b of the conductive layer 6 may be a common roller with a smooth peripheral surface, but, when the roller 20a is a sucking roller with a number of sucking holes on the peripheral surface, the roller 20a may more reliably remove the unnecessary portion 6b from the continuous body 4a of the base material 4.

As the thermoplastic bonding layer may be formed on the whole surface on the side of the conductive layer in comparison with the case of the embodiment 24, according to the embodiment 25, position adjustment between the conductive layer and a heating mold is not required during the heating and bonding process to simplify equipment for manufacturing a conductive member for a non-contact type data carrier.

Furthermore, portions similar to those in FIG. 31 are denoted by the same reference numbers in FIG. 32 as those in FIG. 31, and duplicated description will be eliminated.

Embodiment 26

Figure 33:
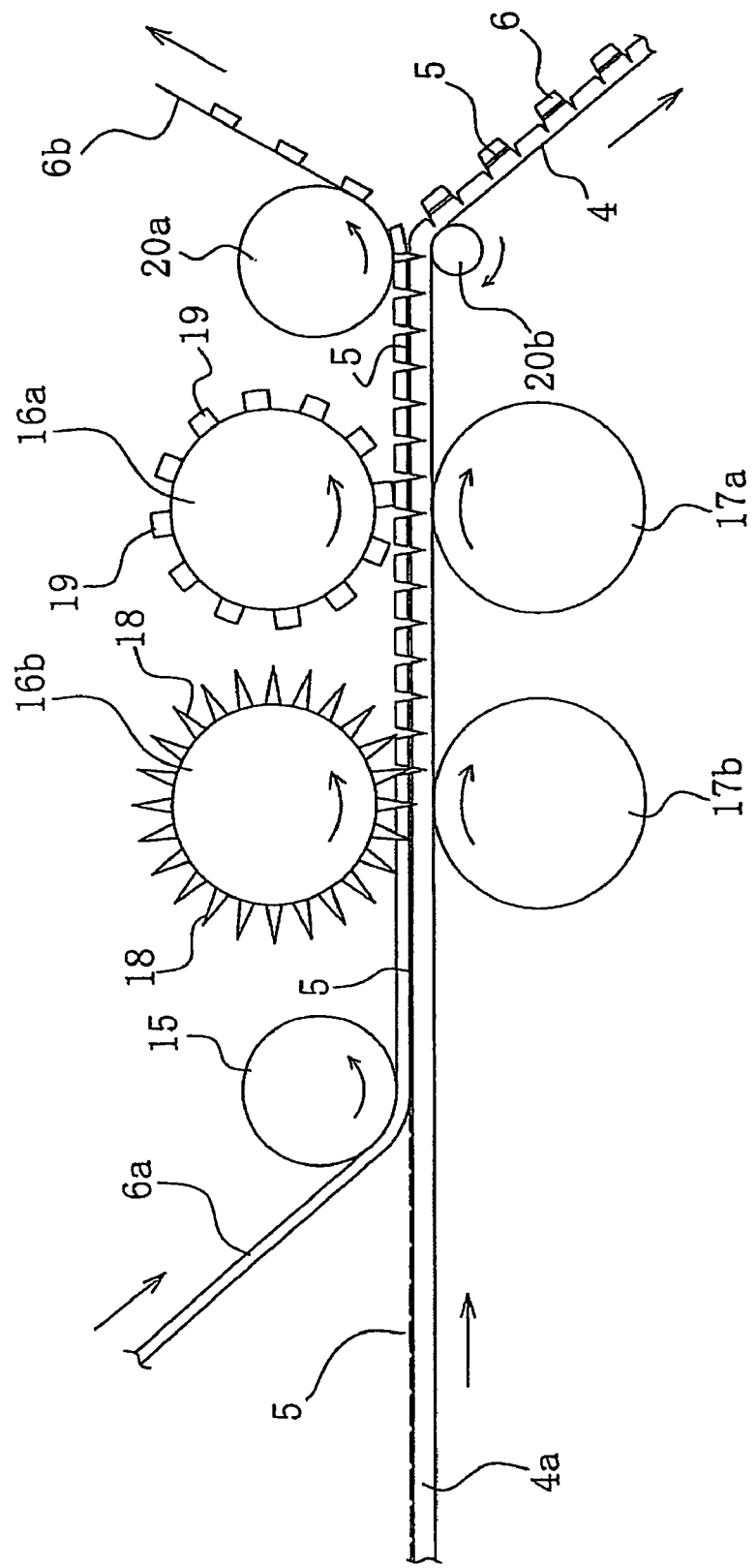
FIG. 33 is a schematic side view of a device for manufacturing an antenna according to an embodiment 26 of the present invention.

As shown in FIG. 33, the present embodiment 26 has a configuration, different from that of the embodiment 22 shown in FIG. 29, in which a conductive layer 6 is bonded after punching.

A continuous body 4a of a base material 4 and a continuous body 6a of metal foil as the conductive layer 6 are drawn into between a processing cylinder 16b and a receiving roller 17b while the bodies 4a and 6a are laminated on each other, and the metal foil is punched in the pattern of an antenna 2 with a punching blade 18. Subsequently, the bodies 4a and 6a are drawn into between a heating cylinder 16a and a receiving roller 17a, a thermoplastic bonding agent layer 5, which is printed in the same pattern as that of the antenna 2 on the continuous body 4a of the base material 4, is melted, by the pattern of a heat transfer body 19 on the heating cylinder 16a, and the punched conductive layer 6 of metal foil is pressed on the above melted thermoplastic bonding agent layer 5.

As the conductive layer 6 is bonded after punching as described above, a deformation of the base material 4, and a wrinkle of the conductive layer 6, which are generated during the punching process, are completely removed by hot pressing during the subsequent heating and bonding process to improve the contacting and bonding properties to the base material 4, enhance the durability, and stabilize the electric performance.

Furthermore, portions similar to those in FIG. 29 are denoted by the same reference numbers in FIG. 33 as those in FIG. 29, and duplicated description will be eliminated.

Embodiment 27

Figure 34:
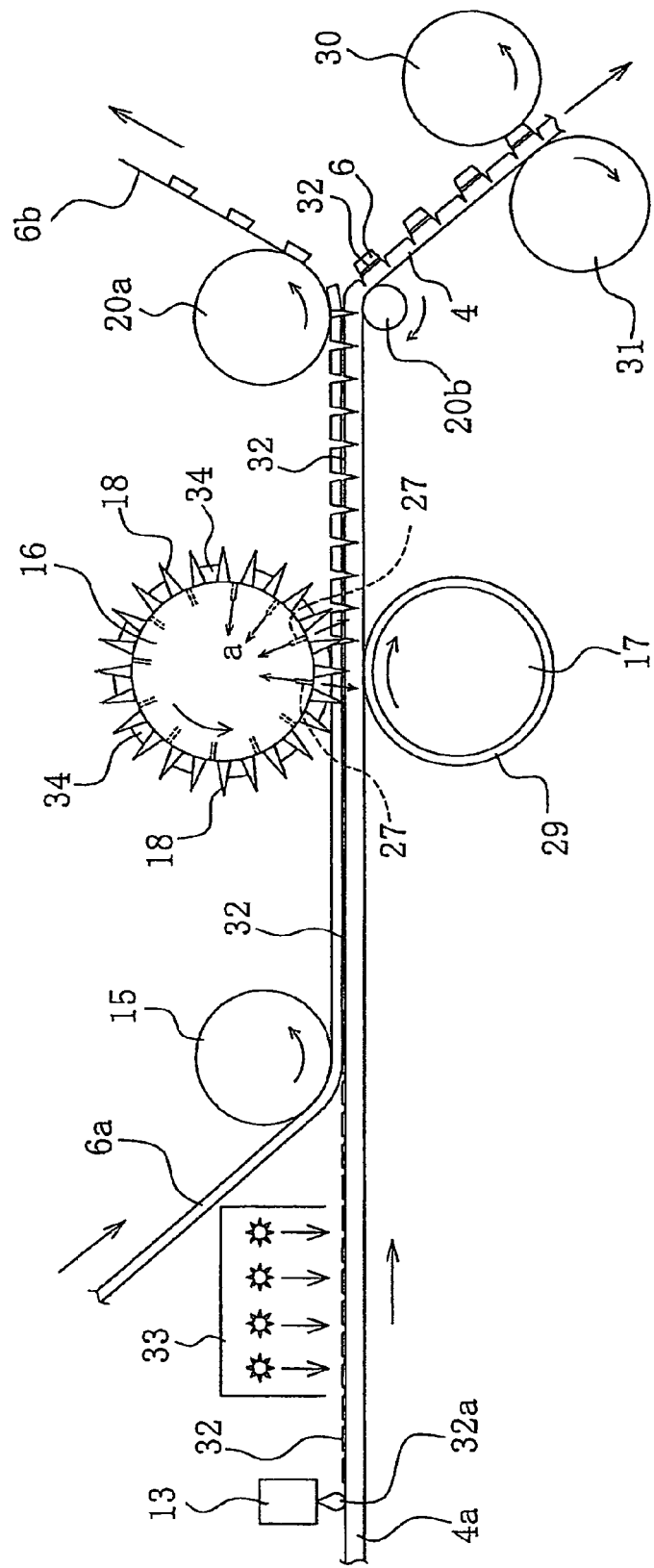
FIG. 34 is a schematic side view of a device for manufacturing an antenna according to an embodiment 27 of the present invention.

As shown in FIG. 34, the present embodiment 27 has a configuration, different from that of the embodiment 12 shown in FIG. 17, in which, in stead of the processing cylinder 16 according to the embodiment 12, the processing cylinder 16 used in the embodiment 1 is used. That is, air holes 27 are formed at positions corresponding to unnecessary-portions except heat transfer bodies 19 in the processing cylinder 16. The air hole 27 functions as sucking means for sucking of the unnecessary portion to the side of the punching blade side, and as discharging means which discharges the unnecessary portion from the side of the punching blade after punching.

When a punching blade 18 punches the conductive layer 6 of the metal foil, the unnecessary portion is sucked to the side of the punching blade by sucking air from the air hole 27, that is, in the direction of the arrow a in the drawing. Thereby, the conductive layer 6 is punched in a more accurate pattern. Moreover, the unnecessary portion is forced out to the outside of the punching blade 18 by blowing air from the air hole 27 in the direction of the arrow b in the drawing after punching. Thereby, the unnecessary portion may be easily collected. Moreover, the unnecessary portion may be prevented from being blocked at a position corresponding to an unnecessary-portion except the heat transfer body 19 in the processing cylinder 16.

Furthermore, portions similar to those in FIGS. 6 and 17 are denoted by the same reference numbers in FIG. 34 as those in FIGS. 6 and 17, and duplicated description will be eliminated.

Embodiment 28

Figure 35:
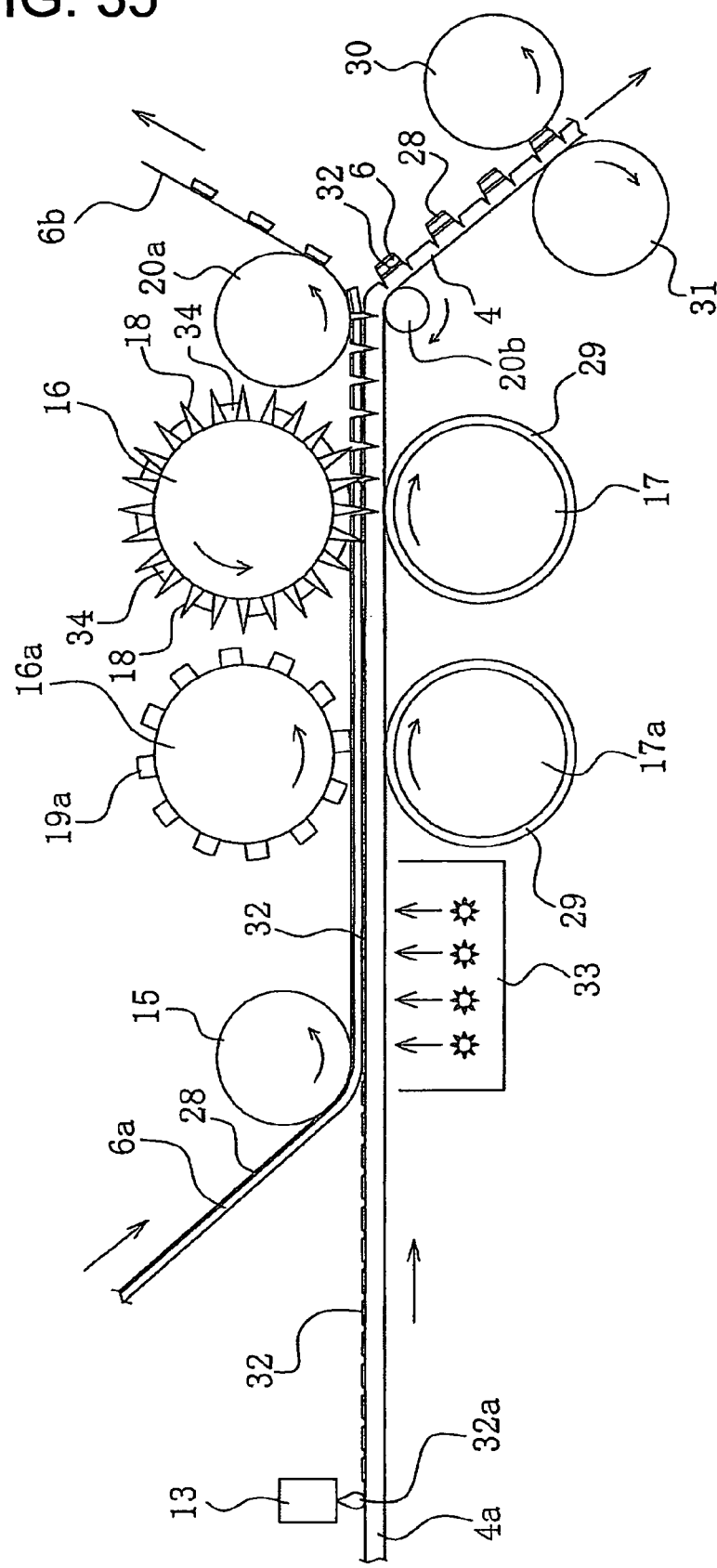
FIG. 35 is a schematic side view of a device for manufacturing an antenna according to an embodiment 28 of the present invention.

As shown in FIG. 35, the present embodiment 28 has a configuration in which, in stead of the processing 16 according to the embodiment 11 shown in FIG. 16, two cylinders 16a and 16b similar to those according to the embodiment 2 shown in FIG. 7 are used, and are arranged along the running direction of a continuous body 4a of a base metal 4 and a continuous body 6a of metal foil as a conductive layer 6. The cylinder 16a on the upstream side is a pressing cylinder on the peripheral surface of which there are formed pressing bodies 19*a* which are formed in a convex state and has a heating pattern corresponding to the pattern of an antenna 2. The cylinder 16*b* on the downstream side is a punching cylinder, and punching blades 18 corresponding to the pattern of the antenna 2 are formed on the peripheral surface thereof.

The continuous body 4*a* of the base metal 4 and the continuous body 6*a* of the metal foil as the conductive layer 6 are drawn into between the heating cylinder 16*a* and the receiving roller 17*a*, and are pressed by the pattern of the pressing body 19*a* on the pressing cylinder 16*a* to a UV or EB curable bonding agent layer 32 which is printed in the same pattern as that of the antenna 2 on the continuous body 4*a* of the base material 4. As a bonding property is given by application of UV or EB to the UV or EB curable bonding agent layer 32 with a shape corresponding to the pattern of the antenna at that time, the conductive layer 6 is bonded to the surface of the continuous body 4*a* of the base material 4, using the above UV or EB curable bonding agent layer 32. Subsequently, the continuous body 4*a* of the base material 4 and the continuous body 6*a* of the metal foil as the conductive layer 6 are drawn into between the processing cylinder 16*b* and the receiving roller 17*b* while the bodies 4*a* and 6*a* are laminated on each other, and the metal foil is punched in the pattern of the antenna 2 with the punching blade 18.

Furthermore, portions similar to those in FIGS. 7 and 16 are denoted by the same reference numbers in FIG. 35 as those in FIGS. 7 and 16, and duplicated description will be eliminated.

Embodiment 29

Figure 36:
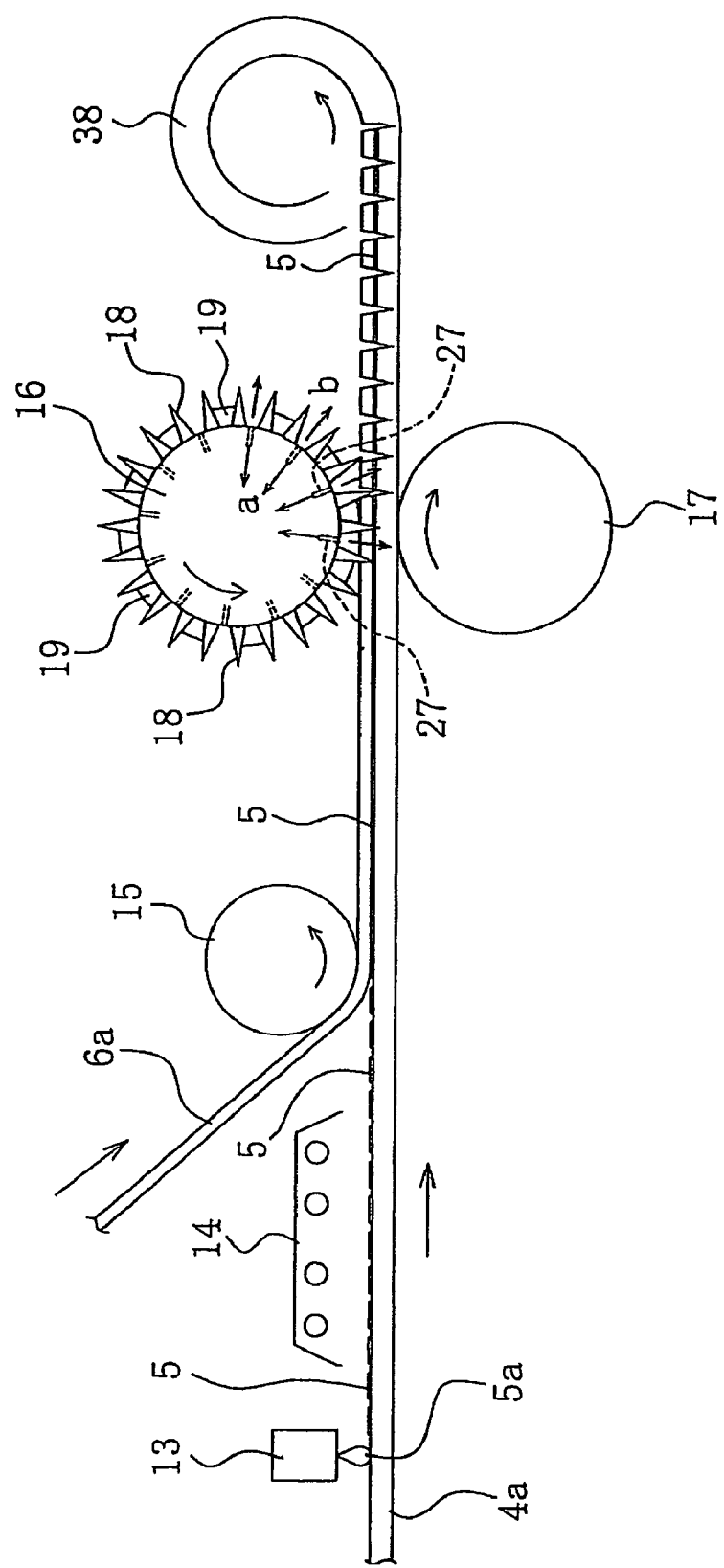
FIG. 36 is a schematic side view of a device for manufacturing an antenna according to an embodiment 29 of the present invention.

As shown in FIG. 36, the present embodiment 29 has a configuration in which the separating rollers 20*a* and 20*b* according to the embodiment 1 shown in FIG. 6 are eliminated, and a continuous body 4*a* of a base material 4 and a continuous body 6*a* of metal foil as a conductive layer 6 are taken up as a take-up roll 38 while the bodies 4*a* and 6*a* are laminated on each other, and slits corresponding to the pattern of the conductive layer 6 are maintained. Or, the bodies 4*a* and 6*a* are laminated on each other after being cut to a predetermined length according to a sheet fed method.

The above take-up roll 38 or sheet is processed by separating rollers 20*a* and 20*b* and the like, which are set up at another place, to remove an unnecessary portion 6*b* of the conductive layer 6.

Here, the separating rollers 20*a* and 20*b* may be eliminated in the same manner as that of the embodiment 29 even in other embodiments.

Embodiment 30

Figure 37:
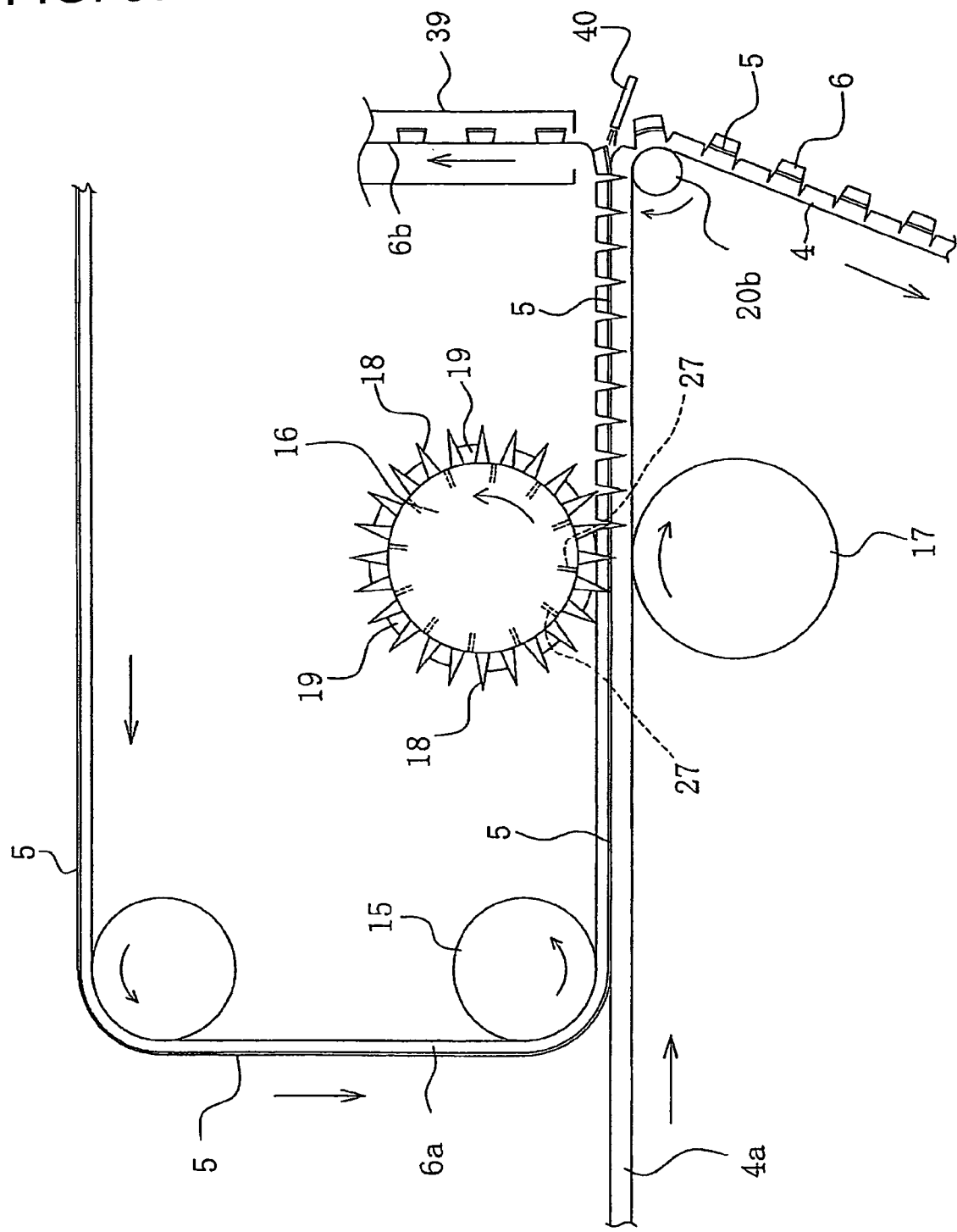
FIG. 37 is a schematic side view of a device for manufacturing an antenna according to an embodiment 30 of the present invention.

As shown in FIG. 37, the present embodiment 30 has a configuration, different from that of the embodiment 25 shown in FIG. 32, in which a sucking tube 39 and a separating roller 20*b* are used as means by which an unnecessary portion 6*b* of a conductive layer 6 is separated from a continuous body 6*a* of a conductive layer 6.

When a continuous body 4*a* of a base material 4 reaches a portion at which a sucking tube 39 and a separating roller 20*b* are provided after, in a continuous body 6*a* of metal foil as a conductive layer 6, only a portion corresponding to the pattern of an antenna is heated and bonded to the continuous body 4*a* of the base material 4 by a processing cylinder 16 and a receiving roller 17, an unnecessary portion 6*b* of the conductive layer 6 is sucked by a sucking tube 39, and, on the other hand, the continuous body 4*a* of the base material 4 is reversed to an acute angle for running while the body 4*a* is guided by a separating roller 20*a*. Thereby, the unnecessary portion 6*b* of the conductive layer 6 is adequately peeled of from the surface of the continuous body 4*a* of the base material 4, and is collected into a not-shown collecting box connected with the sucking tube 39. When the antenna has a spiral pattern, the unnecessary portion 6*b* of the conductive layer 6 is also generated in a spiral state, but, when the portion 6*b* is sucked by the sucking tube 39 as described above, the unnecessary portion 6*b* in the spiral state may be smoothly collected.

As shown in FIG. 37, a nozzle 40 ejecting gas such as air is arranged, as required, at a portion at which the unnecessary portion 6*b* of the conductive layer 6 is separated from the surface of the continuous body 4*a* of the base material 4. As the gas issued from the above nozzle hits a boundary portion between the continuous body 4*a* of the base material 4 and the unnecessary portion 6*b* of the conductive layer 6, peeling and removing of the unnecessary portion 6*b* of the conductive layer 6 is promoted.

Furthermore, portions similar to those in FIG. 32 are denoted by the same reference numbers in FIG. 37 as those in FIG. 32, and duplicated description will be eliminated.

The present invention may adopt the following various kinds of aspects, in addition to the above-described embodiments.

1) A conductive member for non-contact type data carrier in which bonding agent layers (5, 32) are printed on a base material (4) in a predetermined pattern, and a conductive layer (6) comprising metal foil with an approximately similar pattern to the above-described pattern is bonded on the above bonding agent layers (5, 32). The conductive layer (6) is formed on the base material (4) without large bulges, and the bonding agent layers (5, 32) are prevented from squeezing out from the lower side of the conductive layer (6).

2) A method for manufacturing a conductive member for a non-contact type data carrier comprising: a pattern forming process during which a thermoplastic bonding agent layer (5) is formed in a predetermined pattern on the surface of a base material (4) while the base material (4) is run; a bonding process during which a conductive layer (6) is laminated on the thermoplastic bonding agent layer (5) for heating and bonding; and a punching process during which the conductive layer (6) is punched in the above-described pattern on the base material (4). A conventional multilayered sheet is not required. Accordingly, reduction in the material may be realized. Formation of the predetermined pattern may be realized by printing, coating and the like.

3) A method for manufacturing a conductive member for a non-contact type data carrier, comprising: a bonding process during which a base material (4) on the surface of which a thermoplastic bonding agent layer (5) is formed in a predetermined pattern is run, and a conductive layer (6) is laminated on the above thermoplastic bonding agent layer (5) for heating and bonding; and a punching process during which the conductive layer (6) is punched in the above-described pattern on the base material (4). A printing machine, a coating device and the like as a device for forming a pattern of a thermoplastic bonding layer may be separated from equipment for manufacturing a conductive member for a non-contact type data carrier by using a conductive layer on which a thermoplastic bonding layer is formed beforehand in a pattern to simplify the equipment for manufacturing a conductive member for an on-contact type data carrier and to reduce the cost.

4) A method for manufacturing a conductive member for a non-contact type data carrier, comprising: a pattern forming process during which a thermoplastic bonding agent layer (5) is formed in a predetermined pattern on the surface of a base material (4) while the base material (4) is run; a bonding process during which, while a base material (4) is run, a continuous body (6a) of the conductive layer (6) is laminated on the surface of the thermoplastic bonding agent layer (5) for heating and bonding; and a punching process during which the conductive layer (6) is punched in the above-described pattern on the base material (4). A conventional multilayered sheet is not required. Accordingly, reduction in the material may be realized. Formation of the predetermined pattern may be realized by printing, coating and the like.

5) As a method for manufacturing a conductive member for a non-contact type data carrier comprises: a bonding process during which, while a base material (4) is run, a conductive layer (6) on the surface of which a thermoplastic bonding agent layer (5) is formed in a predetermined pattern is laminated on a thermoplastic bonding agent layer (5) for heating and bonding; and a punching process during which the conductive layer (6) is punched in the above-described pattern on the base material (4), a printing machine, a coating device and the like as a device for forming a pattern may be separated from equipment for manufacturing a conductive member for a non-contact type data carrier by using a conductive layer on which a thermoplastic bonding layer is formed beforehand in a pattern to simplify the equipment for manufacturing a conductive member for a non-contact type data carrier and to reduce the cost. Moreover, as the pattern of the thermoplastic bonding layer is formed on the side of the conductive layer, the heating and bonding process is not required to be performed in a pattern, and positioning is not required for example, by heat pressing for the whole surface to simplify the equipment.

6) The method for manufacturing a conductive member for a non-contact type data carrier according to the above-described method 2), in which the bonding process and the punching process are simultaneously performed. Synchronization between the bonding process and the punching process is not required, and, accordingly, the conductive member for a non-contact type data carrier may be simply and accurately manufactured to improve the productivity.

7) The method for manufacturing a conductive member for a non-contact type data carrier according to the above-described method 2), comprising a drying process during which the thermoplastic bonding agent layer (5) formed during the above-described pattern forming process is dried. After a solvent and the like is removed from the thermoplastic bonding agent layer (5), the conductive layer (6) may be bonded to the surface of the base material (4). Accordingly, the conductive layer (6) may be smoothly and uniformly formed on the base material (4). Moreover, the layer (6) may be quickly formed.

8) The method for manufacturing a conductive member for a non-contact type data carrier according to the above-described method 2), comprising: a process during which an unnecessary portion (6b) of the conductive layer (6) is sucked to the side of the punching blade during the punching process, and a discharging process during which the sucked unnecessary portion (6b) is discharged from the side of the punching blade. The conductive layer (6) is punched in an accurate pattern, and the pattern portion and the unnecessary portion may be reliably separated.

9) A device for manufacturing a conductive member for a non-contact type data carrier, comprising: pattern forming means (13) by which a thermoplastic bonding agent layer (5) is formed in a predetermined pattern on the surface of a base material (4) while the base material (4) is run; bonding means (19) by which a conductive layer (6) is laminated on the surface of the above thermoplastic bonding agent layer (5) for heating and bonding; and punching means (18) by which the conductive layer (6) is punched in the above-described pattern on the base material (4). Without using a conventional multilayered sheet, a conductive member for a non-contact type data carrier may be manufactured. Accordingly, reduction in the material may be realized.

10) A device for manufacturing a conductive member for a non-contact type data carrier, comprising: bonding means (19) by which a base material (4) on the surface of which a thermoplastic bonding agent layer (5) is formed in a predetermined pattern is run, and a conductive layer (6) is laminated on the surface of the thermoplastic bonding agent layer (5) for heating and bonding; and punching means (18) by which the conductive layer (6) is punched in the above-described pattern on the base material (4). A printing machine, a coating device and the like as a device for forming a pattern of a thermoplastic bonding layer may be separated from equipment for manufacturing a conductive member for a non-contact type data carrier by using a conductive layer on which a thermoplastic bonding layer is formed beforehand in a pattern to simplify the equipment for manufacturing a conductive member for a non-contact type data carrier and to reduce the cost.

11) A device for manufacturing a conductive member for a non-contact type data carrier comprises: pattern forming means (13) by which, while a conductive layer (6) is run, a thermoplastic bonding layer (5) is formed in a predetermined pattern on the surface thereof; a bonding means (19) by which, while a base material (4) is run, the conductive layer (6) is laminated on the surface of the thermoplastic bonding layer (5) for heating and bonding; and a punching means (18) by which the conductive layer (6) is punched in the above-described pattern on the base material (4). Without using a conventional multilayered sheet, a conductive member for a non-contact type data carrier may be manufactured. Accordingly, reduction in the material may be realized.

12) A device for manufacturing a conductive member for a non-contact type data carrier comprises: a bonding means (19) by which, while a base material (4) is run, a conductive layer (6) on the surface of which a thermoplastic bonding agent layer (5) is formed in a predetermined pattern is laminated on the surface of the thermoplastic bonding layer (5) for heating and bonding; and a punching means (18) by which the conductive layer (6) is punched in the above-described pattern on the base material (4). A printing machine, a coating device and the like as a device for forming a pattern may be separated from equipment for manufacturing a conductive member for a non-contact type data carrier by using a conductive layer on which a thermoplastic bonding layer is formed beforehand in a pattern to simplify equipment for manufacturing a conductive member for a non-contact type data carrier and, at the same time to reduce the cost. Moreover, as the pattern of the thermoplastic bonding layer is formed on the side of the conductive layer, the conductive layer with a predetermined pattern may be obtained by heat pressing for the whole surface without requiring the heating and bonding process to be performed in a pattern, for example, without positioning.

13) The device for manufacturing a conductive member for a non-contact type data carrier according to the above-described device 9), comprising a drying means (14) by which the thermoplastic bonding agent layer (5) formed by the above-described pattern forming means (13) is dried. After a solvent and the like is removed from the thermoplastic bonding agent layer (5), the conductive layer (6) may be bonded to the surface of the base material (4). Accordingly, the conductive layer (6) may be smoothly and uniformly formed on the base material (4). Moreover, the layer (6) may be quickly formed.

14) The device for manufacturing a conductive member for a non-contact type data carrier according to the above-described device 9), wherein the punching means has sucking means (27) which sucks an unnecessary portion (6b) to the side of the punching blade (18) when the conductive layer (6) is punched and discharging means (27) which discharges the unnecessary portion (6b) from the side of the punching blade (18) after punching. The conductive layer (6) is punched in an accurate pattern, and the unnecessary portion may be collected in an easier manner.

15) A method for manufacturing a conductive member for a non-contact type data carrier, comprising: a pattern forming process during which a UV or EB curable bonding agent layer (32) is formed in a predetermined pattern on the surface of a base material (4) while the base material (4) is run; a laminating process during which a conductive layer (6) is laminated on the surface of the UV or EB curable bonding agent layer (32); a UV or EB applying process during which UV or EB is applied from the side of the base material (4) to the UV or EB curable bonding agent layer (32) between the base material (4) and the conductive layer (6), which are running; a bonding process during which the conductive layer (6) is pressed on the base material (4) for bonding; and a punching process during which the conductive layer (6) is punched in the above-described pattern on the base material (4). Obviously, a conventional multilayered sheet is not required, which results in reduction in the material. And the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent.

16) A method for manufacturing a conductive member for a non-contact type data carrier, comprising: a pattern forming process during which a UV or EB curable bonding agent layer (32) is formed in a predetermined pattern on the surface of a base material (4) while the base material (4) is run; a UV or EB applying process during which UV or EB is applied to the UV or EB curable bonding agent layer (32); a laminating process during which a conductive layer (6) is laminated on the surface of the UV or EB curable bonding agent layer (32) to which UV or EB has been applied; a bonding process during which the conductive layer (6) is pressed on the base material (4) for bonding; and a punching process during which the conductive layer (6) is punched in the above-described pattern on the base material (4). Obviously, a conventional multilayered sheet is not required, which results in reduction in the material. As the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent. As UV or EB is applied directly to the UV or EB curable bonding agent layer (32), a bonding property may be given to the UV or EB curable bonding agent layer (32), regardless of the material used for the base material (4).

17) A method for manufacturing a conductive member for a non-contact type data carrier, comprising: a pattern forming process during which a UV or EB curable bonding agent layer (32) is formed in a predetermined pattern on the surface of a conductive layer (6) while the conductive layer (6) is run; a UV or EB applying process during which UV or EB is applied to the UV or EB curable bonding agent layer (32) while the conductive layer (6) is run; a laminating process during which the conductive layer (6) is laminated on the surface of the UV or EB curable bonding agent layer (32) while the base material (4) is run; a bonding process during which the conductive layer (6) is pressed on the base material (4) for bonding; and a punching process during which the conductive layer (6) is punched in the above-described pattern on the base material (4). Obviously, a conventional multilayered sheet is not required, which results in reduction in the material. As the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent. As UV or EB is applied directly to the UV or EB curable bonding agent layer (32), a bonding property may be given to the UV or EB curable bonding agent layer (32), regardless of the material used for the base material in which the UV or EB curable bonding agent layer (32) is provided.

18) The method for manufacturing a conductive member for a non-contact type data carrier according to the above-described method 15), in which the bonding process and the punching process are simultaneously performed. Synchronization between the bonding process and the punching process is not required, and, accordingly, the conductive member for a non-contact type data carrier may be simply and accurately manufactured to improve the productivity.

19) The method for manufacturing a conductive member for a non-contact type data carrier according to the above-described method 15), in which the punching process is performed after the bonding process is completed. Punching may be performed after the conductive layer (6) is fixed on the base material (4). A deviation of the conductive layer (6) from the base material (4) may be prevented, which may have occurred during punching.

20) The method for manufacturing a conductive member for a non-contact type data carrier according to the above-described method 15), in which the bonding process is performed after the punching process is completed. "A deformation of the base material", and "a wrinkle of the conductive layer", which are generated during the punching process, are completely removed by hot pressing during the subsequent heating and bonding process to improve the contacting and bonding properties to the base material, enhance the durability, and stabilize the electric performance.

21) The method for manufacturing a conductive member for a non-contact type data carrier according to the above-described method 15), in which the punching process is performed using a cylinder (16). The manufacturing speed of the conductive member for the non-contact type data carrier may be increased. The cylinder (16) may be used as a rotary die.

22) The method for manufacturing a conductive member for a non-contact type data carrier according to the above-described method 15), in which the punching process is performed using a flat plate (21). The punching pattern of the conductive layer (6) in the punching process may be simply changed. A flat blade knife of a flat press machine may be used as the flat plate (21).

23) The method for manufacturing a conductive member for a non-contact type data carrier according to the above-described method 15), comprising: a process during which an unnecessary portion (6b) of the conductive layer (6) is sucked to the side of the punching blade during the punching process; and a discharging process during which the sucked unnecessary portion (6b) is discharged from the side of the punching blade. The conductive layer (6) is punched in an accurate pattern, and the unnecessary portion may be collected in an easier manner.

24) A device for manufacturing a conductive member for a non-contact type data carrier, comprising: pattern forming means (13) by which a UV or EB curable bonding agent layer (32) is formed in a predetermined pattern on the surface of a base material (4) while the base material (4) is run; laminating means by which the conductive layer (6) is laminated on the surface of the UV or EB curable bonding agent layer (32); UV or EB applying means (33) by which UV or EB is applied from the side of the base material (4) to the UV or EB curable bonding agent layer (32) between the base material (4) and the conductive layer (6), which are running; bonding means (19) by which the conductive layer (6) is laminated on the surface of the base material (4) for bonding; and punching means (18) by which the conductive layer (6) is punched in the above-described pattern on the base material (4). Obviously, a conventional multilayered sheet is not required, which results in reduction in the material. As the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent.

25) A device for manufacturing a conductive member for a non-contact type data carrier, comprising: pattern forming means (13) by which a UV or EB curable bonding agent layer (32) is formed in a predetermined pattern on the surface of a base material (4) while the base material (4) is run; UV or EB applying means (33) by which UV or EB is applied to the UV or EB curable bonding agent layer (32), laminating means (15) by which the conductive layer (6) is laminated on the surface of the UV or EB curable bonding agent layer (32); bonding means (19) by which the conductive layer (6) is laminated on the surface of the base material (4) for bonding; and punching means (18) by which the conductive layer (6) is punched in the above-described pattern on the base material (4). Obviously, a conventional multilayered sheet is not required, which results in reduction in the material. As the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent. As UV or EB is applied directly to the UV or EB curable bonding agent layer (32), a bonding property may be given to the UV or EB curable bonding agent layer (32), regardless of the material used for the base material.

26) A device for manufacturing a conductive member for a non-contact type data carrier, comprising: pattern forming means (13) by which a UV or EB curable bonding agent layer (32) is formed in a predetermined pattern on the surface of the conductive layer (6) while the conductive layer (6) is run; UV or EB applying means (33) by which UV or EB is applied to the UV or EB curable bonding agent layer (32) while the conductive layer (6) is run; laminating means (15) by which the conductive layer (6) is laminated on the surface of the UV or EB curable bonding agent layer (32) while the base material (4) is run; bonding means (19) by which the conductive layer (6) is laminated on the surface of the base material (4) for bonding; and punching means (18) by which the conductive layer (6) is punched in the above-described pattern on the base material (4). Obviously, a conventional multilayered sheet is not required, which results in reduction in the material. As the UV or EB curable bonding agent layer (32) is comparatively quickly cured, the running speed of the base material (4) and that of the conductive layer (6) may be increased to improve the production efficiency. Moreover, it is possible to prevent the temperature of the atmosphere during the process from being increased in comparison with the case in which a thermoplastic bonding agent is used as a bonding agent. As UV or EB is applied directly to the UV or EB curable bonding agent layer (32), a bonding property may be given to the UV or EB curable bonding agent layer (32), regardless of the material used for the continuous body in which the UV or EB curable bonding agent layer (32) is provided.

27) The device for manufacturing a conductive member for a non-contact type data carrier according to the above-described device 24), in which one cylinder or one flat plate has both of bonding means (19) and punching means (18). As bonding and punching may be performed at the same place, the manufacturing device is made compact to reduce the installation space.

28) The device for manufacturing a conductive member for a non-contact type data carrier according to the above-described device 24), in which the punching means comprises: sucking means (27) by which an unnecessary portion (6b) is sucked o the side of a punching blade (18) when the conductive layer (6) is punched; and discharging means (27) by which the unnecessary portion (6b) is discharged from the side of the punching blade (18) after punching. The conductive layer (6) is punched in an accurate pattern, and the unnecessary portion may be collected in an easier manner.

29) The method for manufacturing a conductive member for a non-contact type data carrier according to the above-described method 15), in which a laminated body of the conductive layer (6) and the base material (4) is pressed through a cushioned material during the punching process. At bonding or punching, a uniform pressure may be applied to the laminated body of the conductive layer (6) and the base material (4). Accordingly, the conductive layer (6) with an appropriate pattern may be formed on the base material (4).

30) The device for manufacturing a conductive member for a non-contact type data carrier according to the above-described device 24), in which the punching means (18) has a cushioned pressing body (29) which presses a laminated body of the conductive layer (6) and the base material (4). At bonding or punching, a uniform pressure may be applied to the laminated body of the conductive layer (6) and the base material (4) due to the cushioned pressing body (29). Accordingly, the conductive layer (6) with an appropriate pattern may be formed on the base material (4).

31) The method for manufacturing a conductive member for a non-contact type data carrier according to the above-described method 2), in which the conductive layer (6) the surface of which is covered with a protective layer (28) is used. The conductive layer (6) is prevented from being oxidized, being scratched and the like during manufacturing a conductive member for a non-contact type data carrier.

32) The device for manufacturing a conductive member for a non-contact type data carrier according to the above-described device 9), in which the conductive layer (6) the surface of which is covered with a protective layer (28) is used.

The conductive layer (6) is prevented from being oxidized, being scratched and the like during manufacturing a conductive member for a non-contact type data carrier.

33) The method for manufacturing a conductive member for a non-contact type data carrier according to the above-described method 2), in which a pattern is formed by printing. The bonding agent layer may be formed thin in an appropriate pattern to form the conductive layer (6) with an appropriate thickness and an adequate pattern.

34) The device for manufacturing a conductive member for a non-contact type data carrier according to the above-described device 9), in which a pattern is formed using printing means. The bonding agent layer may be formed thin in an appropriate pattern to form the conductive layer (6) with an appropriate thickness and an adequate pattern.

What is claimed is:

1. A method for manufacturing a conductive member for a non-contact type data carrier, comprising:

a bonding step of laminating a conductive layer on which a thermoplastic bonding agent layer is formed, from a thermoplastic boding agent side, to a base material, to bond the conductive layer to the base material, while traveling the base material, and heating and bonding the conductive layer in a predetermined pattern; a step of punching out the conductive layer on the base material in the predetermined pattern; and a separating process during which an unnecessary portion of the conductive layer is separated from the base material, wherein the unnecessary portion is separated from the base material by ejecting gas to between the unnecessary portion of the conductive layer and the base material under sucking the unnecessary portion.

2. A device for manufacturing a conductive member for a non-contact type data carrier, comprising:

bonding means for laminating a conductive layer on which a thermoplastic bonding agent layer is formed, from a thermoplastic boding agent side, to a base material, to bond the conductive layer to the base material, while traveling the base material, and heating and bonding the conductive layer in a predetermined pattern; punching means in which the conductive layer is punched in the predetermined pattern on the base material; and separating means by which an unnecessary portion of the conductive layer is separated from the base material, wherein the separating means which separates the unnecessary portion of the conductive layer from the base material has sucking means which sucks the unnecessary portion of the conductive layer, and a nozzle which ejects gas to between the unnecessary portion of the conductive layer and the base material.

* * * * *